United States Patent
Yamazaki

(10) Patent No.: US 9,640,668 B2
(45) Date of Patent: May 2, 2017

(54) ELECTRONIC DEVICE, MANUFACTURING METHOD OF ELECTRONIC DEVICE, AND SPUTTERING TARGET

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/524,224

(22) Filed: Oct. 27, 2014

(65) Prior Publication Data

US 2015/0041808 A1    Feb. 12, 2015

Related U.S. Application Data

(62) Division of application No. 13/211,542, filed on Aug. 17, 2011, now Pat. No. 8,883,555.

(30) Foreign Application Priority Data

Aug. 25, 2010    (JP) .................................. 2010-187873

(51) Int. Cl.
*H01L 27/12* (2006.01)
*H01L 29/786* (2006.01)
(Continued)

(52) U.S. Cl.
CPC .......... *H01L 29/7869* (2013.01); *C23C 14/08* (2013.01); *C23C 14/3414* (2013.01);
(Continued)

(58) Field of Classification Search
CPC ................................................. H01L 27/1225
See application file for complete search history.

(56) References Cited

U.S. PATENT DOCUMENTS 3,925,107 A * 12/1975 Gdula ..................... H01L 21/28
257/405
4,772,927 A * 9/1988 Saito ................. H01L 21/32155
257/66
(Continued)

FOREIGN PATENT DOCUMENTS

CN        101164966 A    4/2008
CN        101309863 A    11/2008
(Continued)

OTHER PUBLICATIONS

Kamiya.T et al., "Origins of High Mobility and Low Operation Voltage of Amorphous Oxide TFTs: Electronic Structure, Electron Transport, Defects and Doping", Journal of Display Technology, Jul. 1, 2009, vol. 5, No. 7, pp. 273-288.

(Continued)

*Primary Examiner* — Evan Pert
(74) *Attorney, Agent, or Firm* — Eric J. Robinson; Robinson Intellectual Property Law Office, P.C.

(57) ABSTRACT

A film formation is performed using a target in which a material which is volatilized more easily than gallium when heated at 400° C. to 700° C., such as zinc, is added to gallium oxide by a sputtering method with high mass-productivity which can be applied to a large-area substrate, such as a DC sputtering method or a pulsed DC sputtering method. This film is heated at 400° C. to 700° C., whereby the added material is segregated in the vicinity of a surface of the film. Another portion of the film has a decreased concentration of the added material and a sufficiently high insulating property; therefore, it can be used for a gate insulator of a semiconductor device, or the like.

21 Claims, 8 Drawing Sheets

(51) Int. Cl.
  *C23C 14/08* (2006.01)
  *C23C 14/34* (2006.01)
  *H01L 21/02* (2006.01)
  *H01L 29/49* (2006.01)
  *H01L 29/66* (2006.01)
  *H01L 29/04* (2006.01)
  *H01L 29/24* (2006.01)

(52) U.S. Cl.
  CPC .. *H01L 21/02554* (2013.01); *H01L 21/02565* (2013.01); *H01L 21/02631* (2013.01); *H01L 27/1225* (2013.01); *H01L 29/045* (2013.01); *H01L 29/24* (2013.01); *H01L 29/247* (2013.01); *H01L 29/4908* (2013.01); *H01L 29/66742* (2013.01); *H01L 29/66969* (2013.01); *H01L 29/78693* (2013.01)

(56) References Cited

U.S. PATENT DOCUMENTS

| | | | |
|---|---|---|---|
| 5,393,676 A * | 2/1995 | Anjum | H01L 21/28052 257/E21.199 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,511,343 B2 | 3/2009 | Li et al. | |
| 7,674,650 B2 | 3/2010 | Akimoto et al. | |
| 7,732,819 B2 | 6/2010 | Akimoto et al. | |
| 7,893,495 B2 | 2/2011 | Li et al. | |
| 7,906,780 B2 | 3/2011 | Iwasaki | |
| 7,998,372 B2 | 8/2011 | Yano et al. | |
| 8,012,794 B2 | 9/2011 | Ye | |
| 8,101,949 B2 | 1/2012 | Ye | |
| 8,258,511 B2 | 9/2012 | Ye | |
| 8,349,669 B2 | 1/2013 | Ye | |
| 8,373,164 B2 | 2/2013 | Yamazaki et al. | |
| 8,384,077 B2 | 2/2013 | Yano et al. | |
| 8,415,198 B2 | 4/2013 | Itagaki et al. | |
| 8,421,083 B2 | 4/2013 | Yamazaki et al. | |
| 8,435,843 B2 | 5/2013 | Ye | |
| 8,440,510 B2 | 5/2013 | Yamazaki | |
| 8,502,221 B2 | 8/2013 | Yamazaki | |
| 8,546,182 B2 | 10/2013 | Akimoto et al. | |
| 8,552,434 B2 | 10/2013 | Akimoto et al. | |
| 8,629,434 B2 | 1/2014 | Arai | |
| 8,633,492 B2 | 1/2014 | Akimoto et al. | |
| 8,686,425 B2 | 4/2014 | Yamazaki et al. | |
| 8,759,167 B2 | 6/2014 | Akimoto et al. | |
| 8,772,128 B2 | 7/2014 | Yamazaki et al. | |
| 8,784,700 B2 | 7/2014 | Inoue et al. | |
| 8,803,146 B2 | 8/2014 | Yamazaki et al. | |
| 8,809,132 B2 | 8/2014 | Ye | |
| 8,937,306 B2 | 1/2015 | Yamazaki et al. | |
| 8,981,369 B2 | 3/2015 | Yano et al. | |
| 9,054,134 B2 | 6/2015 | Yamazaki et al. | |
| 9,112,043 B2 | 8/2015 | Arai | |
| 9,281,412 B2 | 3/2016 | Takemura | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0099803 A1 | 5/2008 | Li et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0315160 A1 | 12/2008 | Fukatani et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0174012 A1 | 7/2009 | Iwasaki | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0089623 A1 | 4/2010 | Jang et al. | |
| 2010/0092800 A1 | 4/2010 | Itagaki et al. | |

(56) References Cited

U.S. PATENT DOCUMENTS

| | | | |
|---|---|---|---|
| 2010/0109002 A1 | 5/2010 | Itagaki et al. | |
| 2011/0006301 A1 | 1/2011 | Yamazaki et al. | |
| 2011/0084272 A1* | 4/2011 | Miyanaga | H01L 29/45 257/43 |
| 2011/0101335 A1 | 5/2011 | Yamazaki et al. | |
| 2011/0114944 A1 | 5/2011 | Yamazaki et al. | |
| 2011/0240991 A1 | 10/2011 | Yamazaki | |
| 2011/0312127 A1 | 12/2011 | Ishizuka et al. | |
| 2012/0052624 A1 | 3/2012 | Yamazaki | |
| 2013/0187161 A1* | 7/2013 | Yamazaki | H01L 29/786 257/57 |
| 2013/0193431 A1* | 8/2013 | Yamazaki | H01L 29/78693 257/43 |
| 2013/0270564 A1* | 10/2013 | Yamazaki | H01L 29/78606 257/57 |
| 2014/0001040 A1 | 1/2014 | Inoue et al. | |
| 2014/0030846 A1 | 1/2014 | Akimoto et al. | |
| 2014/0099752 A1 | 4/2014 | Yamazaki et al. | |
| 2014/0151687 A1* | 6/2014 | Yamazaki | H01L 29/66969 257/43 |
| 2014/0197407 A1 | 7/2014 | Yamazaki | |
| 2014/0209900 A1* | 7/2014 | Yamazaki | H01L 29/4908 257/43 |
| 2014/0246673 A1 | 9/2014 | Akimoto et al. | |
| 2014/0339073 A1 | 11/2014 | Inoue et al. | |
| 2014/0339556 A1 | 11/2014 | Yamazaki et al. | |
| 2015/0311347 A1 | 10/2015 | Yamazaki | |

FOREIGN PATENT DOCUMENTS

| | | |
|---|---|---|
| EP | 1737044 A | 12/2006 |
| EP | 1921681 A | 5/2009 |
| EP | 2096188 A | 9/2009 |
| EP | 2226847 A | 9/2010 |
| EP | 2471972 A | 7/2012 |
| EP | 2669402 A | 12/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-324924 A | 11/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2007-201366 A | 8/2007 |
| JP | 2008-098637 A | 4/2008 |
| JP | 2008-163442 A | 7/2008 |
| JP | 2009-099847 A | 5/2009 |
| JP | 2011-527120 | 10/2011 |
| TW | 200822372 | 5/2008 |
| TW | 200931536 | 7/2009 |
| TW | 201029187 | 8/2010 |
| WO | WO-2004/114391 | 12/2004 |
| WO | WO-2007/086291 | 8/2007 |
| WO | WO-2008/023553 | 2/2008 |
| WO | WO-2009/075281 | 6/2009 |
| WO | WO-2010/002608 | 1/2010 |
| WO | WO-2010/002803 | 1/2010 |
| WO | WO-2010/002807 | 1/2010 |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Kimizuka.N et al., "SPINEL,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995; vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshop, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Informational Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

(56) References Cited

OTHER PUBLICATIONS

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-in. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m <4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance amorphous oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

(56) References Cited

OTHER PUBLICATIONS

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Chinese Office Action (Application No. 201110253917.9), dated Apr. 27, 2015.

Taiwanese Office Action (Application No. 100130287), dated May 27, 2015.

* cited by examiner

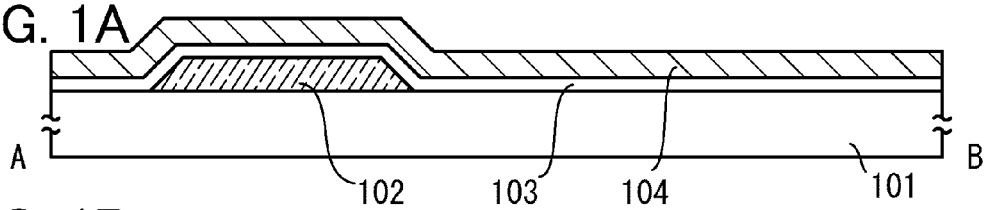
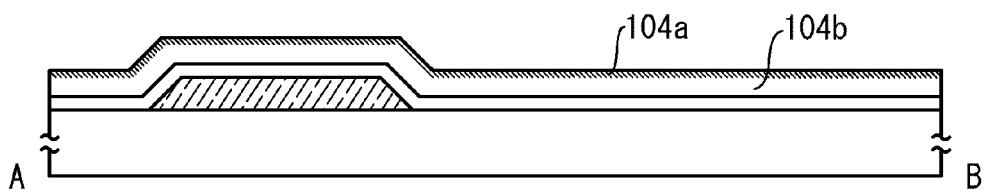
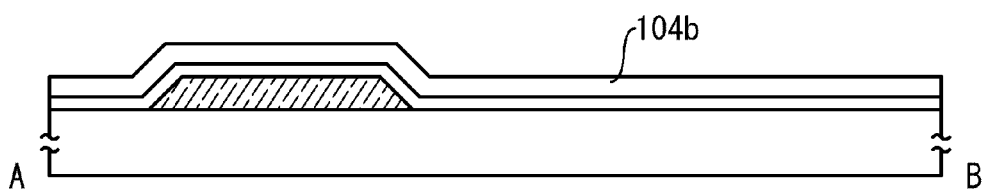
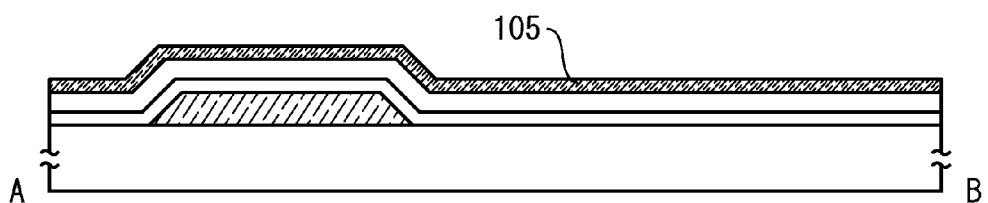
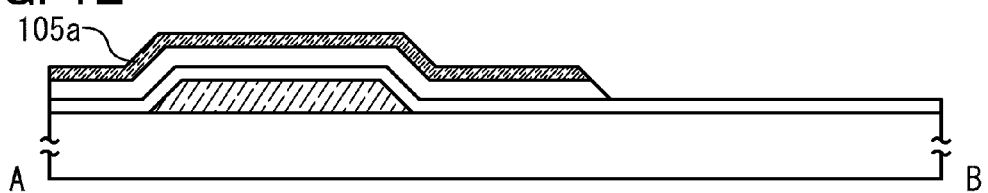
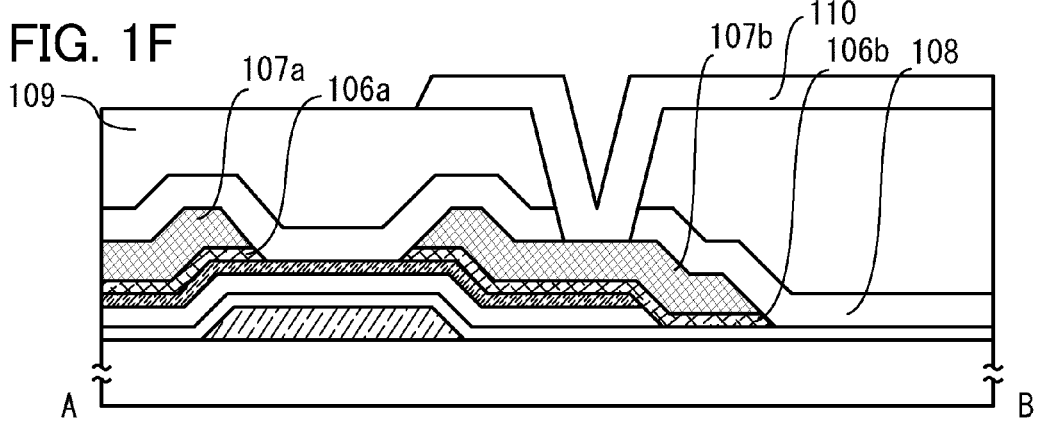

ELECTRONIC DEVICE, MANUFACTURING METHOD OF ELECTRONIC DEVICE, AND SPUTTERING TARGET

BACKGROUND OF THE INVENTION

1. Field of the Invention

The present invention relates to an electronic device including an oxide film, a manufacturing method of the electronic device, and a sputtering target used for manufacturing the oxide film.

Note that an electronic device in this specification refers to any device that utilizes electric properties, and a semiconductor device that can function by utilizing semiconductor characteristics is included in the category of the electronic device. In addition, a device that utilizes electric properties (e.g., a capacitor, a coil, or a variety of electronic tubes), even when the device does not utilize semiconductor characteristics, is included in the category of the electronic device. Therefore, an electro-optical device, a semiconductor circuit, and an electronic appliance are all included in the electronic device.

2. Description of the Related Art

Oxides include oxides having a variety of properties, such as a conductive oxide, a semi-conductive oxide, and an insulating oxide and are used for a variety of applications in accordance with their properties. For example, silicon oxide is a typical insulating oxide and is broadly used for the purpose of element isolation, insulation between wirings, or the like in particular in an integrated circuit. In addition, tantalum oxide, barium titanate, or the like is used as a capacitor dielectric by utilizing an insulating property and a high dielectric constant.

As a conductive oxide, indium oxide (or indium oxide to which tin or the like is added) can be given. It is used as a material for a transparent conductive film utilizing an appropriate conductivity and a high transparent property of visible light. Besides, an yttrium barium copper oxide, a bismuth lead strontium copper oxide, or the like is known as a material having superconductor properties at a temperature of higher than or equal to the boiling point of nitrogen.

Some oxides have semiconductor characteristics. Examples of such oxides having semiconductor characteristics (semi-conductive oxides) are a tungsten oxide, a tin oxide, and an indium-gallium-zinc-based oxide (In—Ga—Zn-based oxide), and a thin film transistor in which such a semi-conductive oxide is used for a channel formation region is known (see Patent Documents 1 and 2). Further, in particular, properties of an In—Ga—Zn-based oxide also have been researched (Non-Patent Document 1).

REFERENCE

Patent Document

[Patent Document 1] Japanese Published Patent Application No. 2007-123861
[Patent Document 2] Japanese Published Patent Application No. 2007-96055

Non-Patent Document

[Non-Patent Document 1] Toshio Kamiya, Kenji Nomura, and Hideo Hosono, "Origins of High Mobility and Low Operation Voltage of Amorphous Oxide TFTs: Electronic Structure, Electron Transport, Defects and Doping", *Journal of Display Technology*, Vol. 5, No. 7, 2009, pp. 273-288.

SUMMARY OF THE INVENTION

In the case where a thin film of such an oxide with a thickness of less than or equal to 1 μm is stacked over a film of another material, a sputtering method is generally employed. A conductive oxide film can be formed by the following method without any problem because a target has sufficient conductivity: an AC sputtering method (a sputtering method in which an alternating current with a frequency of lower than 1 kHz, typically lower than or equal to 100 Hz is used, and the AC sputtering method is referred to as a cycle sputtering method), a DC sputtering method (a sputtering method using a direct current, and the DC sputtering method includes a pulsed DC sputtering method in which voltage is applied in a pulsed manner) in addition to a microwave plasma sputtering method (a sputtering method using a microwave with a frequency of higher than or equal to 100 MHz) and an RF sputtering method (a sputtering method using a microwave with a frequency of higher than or equal to 1 kHz and lower than 100 MHz).

In particular, in consideration of mass productivity, a DC sputtering method or an AC sputtering method is more preferable than a microwave plasma sputtering method or an RF sputtering method. This is because by these methods, large-area plasma can be generated uniformly, so that a large-area substrate can be processed and mass productivity can be increased. In particular, an electronic device which needs a large area, such as a display device, is manufactured by a DC sputtering method or an AC sputtering method, which is preferable and practical.

However, when the conductivity of an oxide is decreased, it becomes difficult to employ a DC sputtering method or an AC sputtering method. This is because when the conductivity of a target is not sufficiently high, stable plasma cannot be generated in these methods.

There are some methods to improve the conductivity of a target. The first method is a method in which oxygen deficiency of an oxide is increased and the carrier concentration in the oxide is increased, so that the conductivity is increased. This method is effective for indium oxide and the like, for example. However, it is difficult to introduce oxygen deficiency in gallium oxide; therefore, the method is not effective.

The second method is a method in which hydrogen is mixed into an oxide and the carrier concentration in the oxide is increased, so that the conductivity is increased. However, hydrogen is brought into a film to be formed in this method. A semi-conductive oxide including hydrogen has unstable electronic characteristics, and in particular, the reliability becomes a big problem in manufacturing a semiconductor device such as a transistor.

The present invention has been made in view of the above-described situation. It is an object of the present invention to obtain an oxide film having a sufficiently high insulating property with mass production. It is another object to provide a novel electronic device (especially, a semiconductor device). It is still another object to provide a manufacturing method of a novel electronic device (especially, a manufacturing method of a semiconductor device).

An embodiment of the present invention disclosed in this specification is a manufacturing method of an electronic device including the steps of: forming an oxide film by a sputtering method using a target which contains an oxide including at least a first metal element and a second metal element; performing heat treatment on the oxide film; and etching a surface of the oxide film to obtain an insulating oxide film. The concentration of the first metal element in the insulating oxide film is lower than or equal to 50% of the concentration of the first metal element in the target.

Another embodiment of the present invention disclosed in this specification is a manufacturing method of an electronic device including the steps of: forming an oxide film by a sputtering method using a target which contains an oxide including at least a first metal element and a second metal element; performing heat treatment on the oxide film; and etching a surface of the oxide film to obtain an insulating oxide film. The conductivity of the target is higher than the conductivity of the insulating oxide film.

Another embodiment of the present invention disclosed in this specification is a manufacturing method of an electronic device including the steps of: forming an oxide film by a sputtering method using a target which contains an oxide including at least a first metal element and a second metal element; and performing heat treatment on the oxide film and reducing the concentration of the first metal element in the oxide to obtain an insulating oxide film.

In any of the above manufacturing methods, a semi-conductive oxide film may be provided in contact with the insulating oxide film.

Another embodiment of the present invention disclosed in this specification is a manufacturing method of an electronic device including the steps of: forming an oxide film by a sputtering method using a target which contains an oxide including at least a first metal element and a second metal element; performing heat treatment on the oxide film to form a region in which the concentration of the first metal element is high; and forming a semi-conductive oxide film in contact with the oxide film. The ratio of the second metal element to a metal element contained in the semi-conductive oxide film is greater than or equal to 0.2.

An embodiment of the present invention disclosed in this specification is a sputtering target which includes a conductive oxide including at least a first metal element and a second metal element and which is used in a device in which film formation is performed by a sputtering method. The oxide of the second metal element itself is an insulating oxide.

In any of the manufacturing methods, a sputtering method may be a DC sputtering method (including a pulsed DC sputtering method) or an AC sputtering method.

An embodiment of the present invention disclosed in this specification is an electronic device including an oxide film over a substrate and a semi-conductive oxide film provided on and in contact with the oxide film. The oxide film includes at least a first metal element and a second metal element. A portion in contact with the semi-conductive oxide film has higher concentration of the first metal element in the oxide film than a portion facing the substrate. On the other hand, the portion in contact with the semi-conductive oxide film has lower concentration of the second metal element in the oxide film than the portion facing the substrate.

In the above, the first metal element may be zinc. The second metal element may be gallium. Further, in the above, the semi-conductive oxide film may have an amorphous state. The semi-conductive oxide film may have a crystal. The semi-conductive oxide film may have a single-crystal state. The crystal may be c-axis-aligned on a surface perpendicularly to the substrate.

In the above, the heat treatment is performed at higher than or equal to 200° C., preferably higher than or equal to 400° C. and lower than 700° C. The atmosphere of the heat treatment is preferably an atmosphere containing oxygen or nitrogen. Further, the pressure is preferably higher than or equal to 10 Pa and lower than or equal to 1 normal atmospheric pressure.

For example, when gallium oxide is used for an electronic device, the conductivity cannot be increased due to oxygen deficiency or hydrogen introduction as described above, or gallium oxide is an undesirable material. However, since the dielectric constant of gallium oxide is high (approximately 10), it is assumed to be used as a capacitor dielectric or a gate insulator of a MISFET (field effect transistor having a metal insulator semiconductor structure). Further, a trap level is not generated at an interface with a semi-conductive oxide; therefore, gallium oxide is assumed to be used as an insulating film (including a gate insulator) provided in contact with such a semiconductor layer. In particular, an interface with an In—Ga—Zn-based oxide is preferable.

However, extremely low mass productivity due to the low conductivity described above is an obstacle. Zinc oxide has high conductivity, and for example, a substance in which aluminum is added to zinc oxide is known as AZO. It can be found from the description of FIG. 12 (Hall mobility and carrier density of a-IGZO) of Non-Patent Document 1 that in a substance in which zinc oxide and gallium oxide are mixed with each other in a ratio of 50:50, conductivity of $5 \times 10^{-3} \Omega^{-1}$ cm$^{-1}$ is obtained in an amorphous state. On the other hand, a substance in which zinc oxide and gallium oxide are mixed with each other in a ratio of 25:75 has a sufficiently high insulating property.

The present inventor found that when heat treatment is performed on such a gallium oxide film containing zinc, zinc is segregated on a surface of the film. That is, zinc which is uniformly distributed in the film is segregated on the surface by heat treatment, and another portion has sufficiently low concentration of zinc and a sufficiently high insulating property.

For example, a gallium oxide film containing zinc is formed over a substrate, and the concentration of zinc in a portion which is facing the substrate or an appropriate portion other than the vicinity of the surface is reduced to 50% or lower of the initial concentration of zinc (i.e., the concentration of zinc in the target) by heat treatment, so that such a portion can have a sufficiently high insulating property as described above and the gallium oxide film containing zinc can be used as an insulating film.

This phenomenon is caused because the vapor pressure of zinc or zinc oxide is higher than the vapor pressure of gallium or gallium oxide in the above heat treatment conditions. Therefore, this phenomenon is caused not only when gallium and zinc are used. This phenomenon might be caused if such a condition is satisfied even when two or more metal elements other than gallium and zinc are combined. For example, an oxide including gallium, aluminum, and zinc may be used instead of an oxide including gallium and zinc.

Further, when the concentration of zinc in the oxide film is measured, the concentration is extremely high in the vicinity of the surface, and tends to increase in the direction to the surface except for the vicinity of the surface. On the other hand, the concentration of gallium tends to decrease in the direction to the surface. Such a phenomenon is also caused because the vapor pressure of zinc or zinc oxide is higher than the vapor pressure of gallium or gallium oxide.

The insulating property is degraded due to the high concentration of zinc in the vicinity of the surface; therefore, a film having a sufficiently high insulating property can be obtained by removing this portion. By such treatment, the conductivity of an oxide film which is finally obtained can be lower than that of a target.

When a semi-conductive oxide film is formed in contact with the oxide film, a portion having high concentration of zinc in the vicinity of the surface may remain.

It is also found that the higher the temperature of the heat treatment is, the lower the pressure is, and the longer the heat treatment time is, the more easily zinc is vaporized from the oxide film and the concentration of zinc in the oxide film is decreased. When the concentration of gallium in the oxide film, that is Ga/(Ga+Zn), is increased to be greater than or equal to 0.7, preferably greater than or equal to 0.8 by such heat treatment, a sufficiently high insulating oxide can be obtained and used for a variety of electronic devices.

Conventionally, there was not a technical idea that a sputtering method is employed using an oxide whose conductivity is increased by adding different metal elements as a target in manufacturing an insulating oxide film. This is because there is no practical method for removing the added metal elements. The above method is innovative in this respect.

With the above embodiments, at least one of the problems can be resolved. For example, an oxide film having a high insulating property can be obtained by a DC sputtering method or an AC sputtering method.

BRIEF DESCRIPTION OF THE DRAWINGS

FIGS. 1A to 1F are cross-sectional views illustrating a manufacturing process of Embodiment 1.

DETAILED DESCRIPTION OF THE INVENTION

Figure 2A:
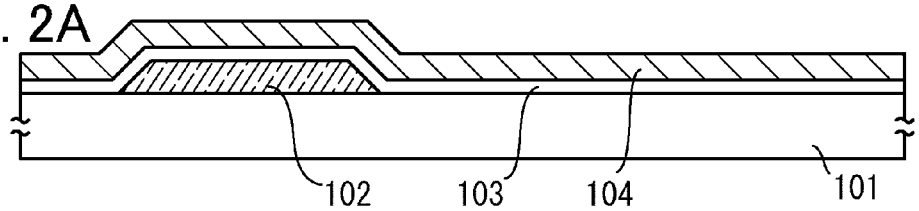
FIGS. 2A to 2F are cross-sectional views illustrating a manufacturing process of Embodiment 2.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

The structures, the conditions, and the like disclosed in any of the following embodiments can be combined with those disclosed in other embodiments as appropriate. Note that in structures described below, the same portions or portions having similar functions are denoted by the same reference numerals in different drawings, and detailed description thereof is not repeated in some cases.

Note that in the following embodiments, an example where the technical idea of the present invention is applied to a display device including a transistor is mainly given; however, it can be easily understood that the technical idea of the present invention is not limited to applying to a display device. Further, terms such as "gate", "source", and "drain" used in the embodiments are used for simple description and are not limited to the interpretation of the meanings of the terms.

For example, "a conductive region and a region incorporated therewith provided so as to get across a semiconductor region over an insulating film provided over the semiconductor region" when normally expressed is simply referred to as a "gate electrode" in this specification. Further, a source and a drain are not particularly distinguished in this specification, and when one is referred to as a source, the other is referred to as a drain.

In addition, it should be noted that the terms such as a conductive oxide, a semi-conductive oxide, and an insulating oxide used in this specification do not have absolute meanings. Even when an oxide has the same composition and the same properties, a name is changed in accordance with the usage in some cases. For example, when an oxide is used for a target of DC sputtering, it is referred to as a conductive oxide. When an oxide is used for a semiconductor layer of a transistor, it is referred to as a semi-conductive oxide in some cases.

An oxide in this specification is an oxide in which the percentage of nitrogen, oxygen, fluorine, sulfur, selenium, chlorine, bromine, tellurium, and iodine (in a molar ratio) contained in a substance (including a compound) is higher than or equal to 25% of the total and the percentage of oxygen to the above elements (in a molar ratio) is higher than or equal to 70%.

A metal element in this specification refers to all elements other than a rare gas element, hydrogen, boron, carbon, nitrogen, a Group 16 element (e.g., oxygen), a Group 17 element (e.g., fluorine), silicon, phosphorus, germanium, arsenic, and antimony.

Further, in this specification, "one metal element is a main metal element" indicates the case where among a plurality of metal elements in a substance, the composition of the metal element is greater than or equal to 50% of the metal elements. In addition, "n metal elements $M_1$, $M_2$, . . . , and $M_n$ are main metal elements" indicates the case where the sum of compositions of the metal elements $M_1$, $M_2$, . . . , and $M_n$ is higher than or equal to $\{(1-2^{-n})\times 100\}$ [%] of the metal elements.

Note that the concentration of an element which is not a main component in a film denoted in this specification is determined by a secondary ion mass spectrometry method unless otherwise specified. In general, when the concentration of an element in a depth direction of a single-layer or multilayer film is measured by a secondary ion mass spectrometry method, in particular in the case of a small amount of an element, the concentration of the element tends to be unusually high at an interface between a substrate and the film or between the films; however, the concentration of such a portion is not an accurate value and measurement variations are large.

It is desirable that the concentration in the vicinity of an interface with low reliability be prevented from being employed and the concentration of a portion which has a stable concentration be used as an index for the accurate concentration of a film; therefore, as the concentration determined by a secondary ion mass spectrometry method, the minimum value obtained by analyzing the object is used in this specification.

Embodiment 1

In this embodiment, an example in which a display device having a transistor is formed using the above-described technical idea will be described. FIGS. 1A to 1F are cross-sectional views illustrating a manufacturing process of the display device of this embodiment. The transistor described in this embodiment is a bottom-gate transistor whose gate electrode is located on the substrate side and a top-contact transistor whose source electrode and drain electrode are in contact with a top surface of a semiconductor layer, and a semi-conductive oxide is used as a semiconductor.

The outline of a manufacturing process will be described below. As illustrated in FIG. 1A, a gate electrode 102, a first gate insulator 103 of silicon oxide, silicon oxynitride, or the like, and an oxide film 104 are formed over a substrate 101 having an insulating surface. The first gate insulator 103 is not necessarily provided. In addition, the oxide film 104 is an oxide of gallium and zinc in this embodiment, and the ratio of gallium, that is, Ga/(Ga+Zn), may be 0.2 to 0.6, preferably 0.3 to 0.5.

There is no particular limitation on a substrate which can be used for the substrate 101; however, the substrate needs to have an insulating surface. For example, a glass substrate made of barium borosilicate glass, aluminoborosilicate glass, or the like can be used; however, one embodiment of the present invention is not limited to this. An insulator such as quartz or sapphire, or a semiconductor having sufficiently high insulating properties, such as silicon carbide, may be used. Further, an insulating film may be formed on a surface of a semiconductor whose insulating properties are not high such as silicon, germanium, or gallium arsenide, on a surface of a semiconductor whose conductivity is increased by doping, or on a surface of copper, aluminum, or the like.

In the case where unfavorable impurities for a transistor are included in a substrate, it is preferable that a film of an insulating material having a function of blocking the impurities (e.g., aluminum nitride, aluminum oxide, or silicon nitride) be provided on a surface. Note that in this embodiment, the first gate insulator 103 can have a similar function.

The gate electrode 102 can be formed in a single layer or a stacked layer using a metal element such as molybdenum, titanium, chromium, tantalum, tungsten, aluminum, or copper, or an alloy material which includes any of these materials as a main metal element. Because the threshold value or the like of the obtained transistor is changed due to a work function of a material to be used for the gate electrode 102, it is necessary to select a material in accordance with the required threshold.

It is necessary to determine the thickness of the first gate insulator 103 in accordance with the composition and thickness of the oxide film 104. Description thereof will be made later. The first gate insulator 103 may be formed by a known sputtering method, a known CVD method, or the like.

The oxide film 104 is formed by a DC sputtering method or an AC sputtering method. As a DC sputtering method, a pulsed DC sputtering method in which voltage is applied in a pulsed manner may be used in order to prevent an abnormal arc discharge. An AC sputtering method needs not to prevent an abnormal arc discharge; therefore, the proportion of plasma generation period by an AC sputtering method is two times or more as long as a pulsed DC sputtering method and mass productivity is high.

A target to be used may be an oxide in which the ratio of gallium to zinc is adjusted so that the oxide film 104 takes the above-mentioned value. Note that in sputtering, the composition of the target is different from the composition of the obtained film depending on an atmosphere and temperature of a deposition surface; for example, even when a conductive target is used, the concentration of zinc of the obtained film is decreased, so that the obtained film has insulating properties or semi-conductivity in some cases.

In this embodiment, an oxide of zinc and gallium is used; the vapor pressure of zinc or zinc oxide at higher than or equal to 200° C. is higher than that of gallium or gallium oxide. Therefore, when the substrate 101 is heated at higher than or equal to 200° C., the concentration of zinc of the oxide film 104 is lower than the concentration of zinc of the target. Accordingly, in consideration of the fact, it is necessary that the concentration of zinc of the target be set at a higher concentration. In general, when the concentration of zinc is increased, the conductivity of an oxide is improved; therefore, a DC sputtering method is preferably used.

The target for sputtering can be obtained in such a manner that after a powder of gallium oxide and a powder of zinc oxide are mixed and pre-baked, molding is performed; then, baking is performed. Alternatively, it is preferable that a powder of gallium oxide whose grain size is less than or equal to 100 nm and a powder of zinc oxide whose grain size is less than or equal to 100 nm be sufficiently mixed and molded.

The oxide film 104 is desirably formed by a method in which hydrogen, water, or the like does not easily enter the oxide film 104. The atmosphere in film formation may be a rare gas (typically argon) atmosphere, an oxygen atmosphere, a mixed atmosphere of a rare gas and oxygen, or the like. Moreover, it is desirably an atmosphere using a high-purity gas from which impurities such as hydrogen, water, a hydroxyl group, and hydride are sufficiently removed because entry of hydrogen, water, a hydroxyl group, hydride, and the like into the oxide film 104 can be prevented.

The entry of the impurities can also be prevented when the substrate temperature in film formation is set to higher than or equal to 100° C. and lower than or equal to 600° C., preferably higher than or equal to 200° C. and lower than or equal to 400° C. In addition, an entrapment vacuum pump such as a cryopump, an ion pump, or a titanium sublimation pump or a turbo molecular pump provided with a cold trap may be used as an evacuation unit.

In the deposition chamber which is evacuated with the above-described evacuation unit, a hydrogen molecule, a compound containing a hydrogen atom such as water ($H_2O$), (preferably, also a compound containing a carbon atom), and the like are removed. Accordingly, the concentration of impurities in the oxide film 104 formed in the deposition chamber can be reduced.

Next, the substrate 101 provided with these is heated at 400° C. to 700° C. for 10 minutes to 24 hours under an appropriate atmosphere, for example, under the condition that the pressure is 10 Pa to 1 normal atmospheric pressure and an atmosphere is any of an oxygen atmosphere, a nitrogen atmosphere, and a mixed atmosphere of oxygen and nitrogen. Then, the quality of the oxide film 104 is changed as illustrated in FIG. 1B, and a semi-conductive oxide layer 104a having high concentration of zinc is formed in the vicinity of a surface of the oxide film 104, and another portion becomes an insulating oxide layer 104b having low concentration of zinc.

Note that the concentration of zinc is changed continuously as described above, the boundary between the semi-conductive oxide layer 104a and the insulating oxide layer 104b is not clear. In addition, as the heating period is longer, the heating temperature is higher, and the pressure in heating is lower, zinc is easily evaporated and the semi-conductive oxide layer 104a tends to be thin.

The obtained semi-conductive oxide layer 104a is removed as illustrated in FIG. 1C. Dry etching or wet etching may be performed to remove the semi-conductive oxide layer 104a. At this time, not only the semi-conductive oxide layer 104a but also a portion of the insulating oxide layer 104b, which is close to the semi-conductive oxide layer 104a may be etched. For example, a portion regarded as the insulating oxide layer 104b, which is close to the semi-conductive oxide layer 104a, may be etched by 10% to 50% of the thickness of the insulating oxide layer 104b.

Instead of removing the semi-conductive oxide layer 104a by etching, the semi-conductive oxide layer 104a may be removed by continuing the heat treatment and vaporizing the semi-conductive oxide layer 104a.

In this manner, the insulating oxide layer 104b appears, and the ratio of gallium, that is, Ga/(Ga+Zn), may be greater than or equal to 0.7, preferably greater than or equal to 0.8 on a surface of the insulating oxide layer 104b. In the insulating oxide layer 104b, a portion close to the surface has the lowest value of gallium and the ratio is increased toward the substrate.

The concentration of zinc in the insulating oxide layer 104b is preferably 50% or lower of the concentration of zinc in the target. Needless to say, the resistivity of the insulating oxide layer 104b is higher than the resistivity of the target.

Note that in this heat treatment, an alkali metal such as lithium, sodium, or potassium is also segregated in the vicinity of the surface of the semi-conductive oxide layer 104a or evaporated; therefore, the concentration in the insulating oxide layer 104b is sufficiently reduced. These alkali metals are unfavorable elements for a transistor; thus, it is preferable that these alkali metals be contained in a material used for forming the transistor as little as possible. Since these alkali metals are easily evaporated compared to zinc; therefore, a heat treatment step is advantageous in removing these alkali metals.

For example, the concentration of sodium in the insulating oxide layer 104b may be lower than or equal to $5\times10^{16}$ cm$^{-3}$, preferably lower than or equal to $1\times10^{16}$ cm$^{-3}$, more preferably lower than or equal to $1\times10^{15}$ cm$^{-3}$. Similarly, the concentration of lithium in the insulating oxide layer 104b may be lower than or equal to $5\times10^{15}$ cm$^{-3}$, preferably lower than or equal to $1\times10^{15}$ cm$^{-3}$ and the concentration of potassium in the insulating oxide layer 104b may be lower than or equal to $5\times10^{15}$ cm$^{-3}$, preferably lower than or equal to $1\times10^{15}$ cm$^{-3}$.

The insulating oxide layer 104b obtained in this manner functions as a gate insulator of the transistor. In other words, the thickness of the gate insulator of the transistor is the sum of the thickness of the first gate insulator 103 and the thickness of the insulating oxide layer 104b. Therefore, the thickness of the first gate insulator 103 needs to be determined in consideration of the insulating oxide layer 104b.

The thickness of the insulating oxide layer 104b depends not only on the thickness of the oxide film 104 but also on the ratio of zinc contained in the oxide film 104. In general, as the ratio of zinc is higher, the insulating oxide layer 104b becomes thinner. Therefore, the thickness of the first gate insulator 103 needs to be determined in accordance with the composition and thickness of the oxide film 104, as described above.

For example, in the case of a transistor used for a general liquid crystal display device or a general electroluminescence display device, the thickness of a gate insulator is 50 nm to 1 µm. For example, in the case where the thickness of the oxide film 104 is 200 nm and the ratio of gallium, that is, Ga/(Ga+Zn), in the oxide film 104 is 0.5, the thickness of the obtained insulating oxide layer 104b is 100 nm to 150 nm. Note that the dielectric constant of the insulating oxide layer 104b is approximately 2.5 times as high as that of silicon oxide because gallium is a main metal element.

In the case where the first gate insulator 103 is formed using silicon oxide and the silicon oxide equivalent thickness of the total gate insulator (the first gate insulator 103 and the insulating oxide layer 104b) is 200 nm, the thickness of the first gate insulator 103 may be 140 nm to 160 nm.

Note that the optimum thickness of the gate insulator is set by voltage applied to the gate electrode or the like, as appropriate. In general, in the case where the applied voltage is low, the gate insulator is set to be thin, whereas in the case where the applied voltage is high, the gate insulator is set to be thick.

In this embodiment, the insulating oxide layer 104b in which gallium is a main metal element is represented by a chemical formula, $Ga_xZn_{1-x}O_y$ (note that X≥0.7); however, it is preferable that oxygen exceed the stoichiometric ratio so as to satisfy $x/2+1<y<x/2+1.5$. In order to achieve this, after the surface of the insulating oxide layer 104b is exposed as illustrated in FIG. 1C, heat treatment may be performed under an oxygen atmosphere or exposure to oxygen plasma may be performed.

Note that an impurity element, e.g., a Group 3 element such as yttrium, a Group 4 element such as hafnium, or a Group 13 element such as aluminum is contained in the oxide film 104, the energy gap of the insulating oxide layer 104b to be obtained later may be increased and the insulating properties may be enhanced. The energy gap of gallium oxide which does not contain any of the above impurities is 4.9 eV; however, when the gallium oxide contains any of the above impurities at about, for example, greater than 0 atomic % and less than or equal to 20 atomic %, the energy gap can be increased to about 6 eV.

After that, a semi-conductive oxide film 105 is formed as illustrated in FIG. 1D. The semi-conductive oxide film 105 preferably contains at least indium (In) or zinc (Zn). In particular, In and Zn are preferably contained. As a stabilizer for reducing variation in electric characteristics of a transistor including the semi-conductive oxide, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the semi-conductive oxide, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an In—Ga—Zn-based oxide means an oxide containing In, Ga, and Zn as main metal elements, and there is no limitation on the ratio of In:Ga:Zn. Further, the In—Ga—Zn-based oxide may contain a metal element other than In, Ga, and Zn.

Alternatively, an oxide represented by a chemical formula, $InMO_3(ZnO)_m$ (m>0) may be used as a semi-conductive oxide. Here, M represents one or more metal elements selected from Zn, Ga, Al, Sn, and In. For example, M can be Ga or two kinds of metals such as Ga and Al, Ga and Sn, or Ga and In.

In the case where an In—Zn-based oxide is used as a semi-conductive oxide, a target to be used has a composition ratio of In:Zn=50:1 to 1:2 in an atomic ratio ($In_2O_3$:ZnO=25:1 to 1:4 in a molar ratio), preferably, In:Zn=1:1 to 1:20 in an atomic ratio ($In_2O_3$:ZnO=10:1 to 1:2 in a molar ratio), further preferably, In:Zn=1.5:1 to 15:1 in an atomic ratio ($In_2O_3$:ZnO=3:4 to 15:2 in a molar ratio). For example, a target used for the formation of an In—Zn-based oxide has an atomic ratio of In:Zn:O=1:1:X, where X>1, preferably X>1.5.

Alternatively, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having the appropriate composition may be used depending on necessary semiconductor characteristics (mobility, threshold value, variation, and the like). In order to obtain necessary semiconductor characteristics, it is preferable that the carrier concentration, the impurity concentration, the defect density, the atomic ratio of a metal element to oxygen, the interatomic distance, the density, and the like be set to be appropriate.

For example, it is relatively easy to obtain high mobility of an In—Sn—Zn-based oxide. However, mobility can be increased by a decrease in defect density in a bulk even in an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The semi-conductive oxide may be either single crystal or non-single-crystal. In the latter case, the semi-conductive oxide may be either amorphous or polycrystal. Further, the semi-conductive oxide may have either an amorphous structure including a portion having crystallinity or a non-amorphous structure.

In this embodiment, an In—Ga—Zn-based oxide is used as a semi-conductive oxide. In other words, the semi-conductive oxide film is formed using an In—Ga—Zn-based oxide as a target by a sputtering method. The filling rate of the oxide target is higher than or equal to 90% and lower than or equal to 100%, preferably, higher than or equal to 95% and lower than or equal to 99.9%. With the use of the oxide target with high filling rate, a semi-conductive oxide film to be obtained can have high density.

The composition ratio of the target can be, for example, In:Ga:Zn=1:1:1 [molar ratio]. Note that it is not necessary to limit the material and composition ratio of the target to the above. For example, an oxide target with the following composition ratio may alternatively be used: In:Ga:Zn=1:1:0.5 [molar ratio], In:Ga:Zn=2:1:3 [molar ratio], and In:Ga:Zn=3:1:2 [molar ratio].

As described later, as for the composition of an obtained semi-conductive oxide film, it is preferable that the ratio of gallium in a metal component (in a molar ratio) be greater than or equal to 0.2. For example, in the case where In:Ga:Zn=1:1:1, the ratio of gallium is 0.33, whereas in the case where In:Ga:Zn=1:1:0.5, the ratio of gallium is 0.4.

The semi-conductive oxide film 105 is desirably formed by a method in which hydrogen, water, or the like does not easily enter the semi-conductive oxide film 105. The atmosphere in film formation may be a rare gas (typically argon) atmosphere, an oxygen atmosphere, a mixed atmosphere of a rare gas and oxygen, or the like. An atmosphere of a high-purity gas from which an impurity such as hydrogen, water, a hydroxyl group, or hydride is removed is preferable, in order to prevent hydrogen, water, a hydroxyl group, hydride, or the like from entering the semi-conductive oxide film 105.

The thickness of the semi-conductive oxide film 105 is desirably greater than or equal to 3 nm and less than or equal to 30 nm. This is because when the thickness of the semi-conductive oxide film is too large (e.g., when the thickness is greater than or equal to 50 nm), the transistor might be normally on.

The entry of the impurities can also be prevented when the substrate temperature in film formation is set to higher than or equal to 100° C. and lower than or equal to 600° C., preferably higher than or equal to 200° C. and lower than or equal to 400° C. In addition, an entrapment vacuum pump such as a cryopump, an ion pump, or a titanium sublimation pump or a turbo molecular pump provided with a cold trap may be used as an evacuation unit.

In the deposition chamber which is evacuated with the above-described evacuation unit, a hydrogen molecule, and a compound containing a hydrogen atom such as water ($H_2O$) and a compound containing a carbon atom are removed. Accordingly, the concentration of impurities in the semi-conductive oxide film 105 formed in the deposition chamber can be reduced.

An alkali metal such as lithium, sodium, or potassium or an alkaline-earth metal is unfavorable element for the case where a semi-conductive oxide is used for a transistor; therefore, it is preferable that an alkali metal or an alkaline-earth metal be contained in a material used for forming the transistor as little as possible.

Of alkali metals, in particular, sodium is dispersed in an insulating oxide which is in contact with a semi-conductive oxide to be a sodium ion. Alternatively, sodium cuts a bond between a metal element and oxygen or enters the bond in the semi-conductive oxide. As a result, transistor characteristics deteriorate (e.g., the transistor becomes normally-on (the shift of a threshold voltage to a negative side) or the mobility is decreased). In addition, this also causes variation in the characteristics.

Such a problem is significant especially in the case where the concentration of hydrogen in the semi-conductive oxide is extremely low. Therefore, the concentration of an alkali metal is strongly required to be extremely low in the case where the concentration of hydrogen in the semi-conductive oxide is lower than or equal to $5\times10^{19}$ cm$^{-3}$, particularly lower than or equal to $5\times10^{18}$ cm$^{-3}$.

For example, the concentration of sodium in the semi-conductive oxide film 105 may be lower than or equal to $5\times10^{16}$ cm$^{-3}$, preferably lower than or equal to $1\times10^{16}$ cm$^{-3}$, more preferably lower than or equal to $1\times10^{15}$ cm$^{-3}$. Similarly, the concentration of lithium in the semi-conductive oxide film 105 may be lower than or equal to $5\times10^{15}$ cm$^{-3}$, preferably lower than or equal to $1\times10^{15}$ cm$^{-3}$ and the concentration of potassium in the semi-conductive oxide film 105 may be lower than or equal to $5\times10^{15}$ cm$^{-3}$, preferably lower than or equal to $1\times10^{15}$ cm$^{-3}$.

Then, as illustrated in FIG. 1E, the semi-conductive oxide film 105 and the insulating oxide layer 104b are etched, whereby a semi-conductive oxide film 105a having a desired shape (e.g., island shape) is obtained. In the etching, a dry etching method or a wet etching method may be used. Note that as the etching here, the first gate insulator 103 may be used as an etching stopper.

Then, heat treatment (first heat treatment) is performed on the semi-conductive oxide film 105a. Excessive hydrogen (including water and a hydroxyl group) in the semi-conductive oxide film 105a can be removed by the first heat treatment; the structure of the semi-conductive oxide film 105a can be improved; and defect levels in the energy gap can be reduced. The temperature of the first heat treatment is higher than or equal to 250° C. and lower than or equal to 650° C.

Further, excessive hydrogen (including water and a hydroxyl group) in the first gate insulator 103 and the insulating oxide layer 104b can also be removed by the first heat treatment.

The first heat treatment can be referred to as dehydration treatment, dehydrogenation treatment, or the like because of its effect of removing hydrogen, water, and the like. The first heat treatment can be implemented not only just after the semi-conductive oxide film 105a is formed as described above but also at any timing after the semi-conductive oxide film 105 is formed. In addition, similar dehydration treatment or dehydrogenation treatment may be performed plural times instead of one.

The first heat treatment can be performed in such a manner that, for example, an object is introduced into an electric furnace in which a resistance heating element or the like is used and heated under a nitrogen atmosphere. During the first heat treatment, the semi-conductive oxide film 105a is not exposed to the air to prevent entry of water and hydrogen.

The heat treatment apparatus is not limited to the electric furnace and may be an apparatus for heating an object by thermal radiation or thermal conduction from a medium such as a heated gas. For example, a rapid thermal anneal (RTA) apparatus such as a gas rapid thermal anneal (GRTA) apparatus or a lamp rapid thermal anneal (LRTA) apparatus can be used.

An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object by heat treatment, such as nitrogen or a rare gas such as argon is used.

For example, as the first heat treatment, the GRTA process may be performed as follows. The object is put in a heated inert gas atmosphere, heated for several minutes, and taken out of the inert gas atmosphere. The GRTA process enables high-temperature heat treatment for a short time. Moreover, the GRTA process can be employed even when the temperature exceeds the upper temperature limit of the object. Note that the inert gas may be switched to a gas including oxygen during the process. This is because defect levels in the energy gap due to oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is lower than or equal to 1 ppm, preferably lower than or equal to 0.1 ppm).

In any case, when impurities contained in the semi-conductive oxide film 105a are reduced by the first heat treatment to form an intrinsic or substantially intrinsic semiconductor, a transistor with extremely excellent characteristics can be realized.

Further, by heat treatment including the first heat treatment, the semi-conductive oxide film 105a can have various states. That is, it has an amorphous state under a certain condition. Under another condition, it has a state such that crystals partly float in an amorphous state. Under still another condition, it has a single crystal state or a state in which crystals are orderly aligned and which can be regarded as a single crystal state.

In the case where crystals exist in the semi-conductive oxide film 105a, the semi-conductive oxide film 105a preferably has a state in which the c-axis (in the case where the c-axis exists in a crystal structure of a semi-conductive oxide) is preferentially aligned to the substrate (c-axis-aligned state). A state of the semi-conductive oxide film 105a depends on heat treatment conditions or the composition of the semi-conductive oxide film 105a.

Then, a semi-conductive oxide film having n-type conductivity and a conductive film of a metal or the like are deposited. For the formation of these films, a sputtering method may be used. For the n-type semi-conductive oxide film, indium oxide, indium tin oxide, zinc oxide, zinc aluminum oxide, or the like may be used. Note that the n-type semi-conductive oxide film is provided to reduce contact resistance between a source electrode and a drain electrode and the semi-conductive oxide film 105a; however, the n-type semi-conductive oxide film is not necessarily provided depending on the kinds of metals to be used for the source electrode and the drain electrode.

As the conductive film, for example, a metal film containing an element selected from aluminum, chromium, copper, tantalum, titanium, molybdenum, tungsten, and the like, or a metal nitride film containing any of the above elements as a main metal component (e.g., a titanium nitride film, a molybdenum nitride film, or a tungsten nitride film) can be used.

Alternatively, a film of a high-melting-point metal such as titanium, molybdenum, or tungsten or a metal nitride film (e.g., a titanium nitride film, a molybdenum nitride film, or a tungsten nitride film) may be formed over or/and below the metal film such as an Al film or a Cu film.

Then, these are processed into desired shapes, and n-type semi-conductive oxide films 106a and 106b, a source electrode 107a, and a drain electrode 107b are formed. In the above manner, a basic structure of a transistor is completed. Note that in etching of the conductive film, part of the semi-conductive oxide film 105a is etched and a groove portion (depression portion) is formed in the semi-conductive oxide film 105a, in some cases.

Plasma treatment may be performed using an oxidizing gas such as oxygen or ozone, and the adsorbed water attached to the surface of the exposed semi-conductive oxide film 105a may be removed. Note that in the plasma treatment, it is preferable that the concentration of nitrogen or that of argon in the gas be lower than 50%.

Further, a first insulator 108 is formed by a sputtering method, a CVD method, or the like. In the case where the plasma treatment is performed, it is preferable that the first insulator 108 be successively formed without the substrate 101 being taken out to an air atmosphere after the plasma treatment because an atmospheric component (in particular, water) is not adsorbed on the surface of the semi-conductive oxide film 105a.

The first insulator 108 can be formed typically using an inorganic insulator such as silicon oxide, silicon oxynitride, aluminum oxide, or aluminum oxynitride. In particular, it is preferable to use an oxide because of the reason to be described below, and oxygen that is equivalent to or exceeds the stoichiometric ratio is preferably contained.

The second heat treatment is preferably performed after the first insulator 108 is formed. The second heat treatment is performed at a temperature higher than or equal to 150° C. and lower than or equal to 600° C., preferably higher than or equal to 250° C. and lower than or equal to 450° C.

The second heat treatment may be performed in an atmosphere of nitrogen, oxygen, ultra-dry air (air in which the water content is less than or equal to 20 ppm, preferably less than or equal to 1 ppm, more preferably less than or equal to 10 ppb), or a rare gas (argon, helium, or the like). It is also preferable that the purity of nitrogen, oxygen, or the rare gas which is introduced into a heat treatment apparatus be set to be greater than or equal to 6N, preferably greater than or equal to 7N (that is, the impurity concentration is lower than or equal to 1 ppm, preferably lower than or equal to 0.1 ppm).

In the second heat treatment, the semi-conductive oxide film 105a and the first insulator 108 are heated in a state where the semi-conductive oxide film 105a is in contact with the first insulator 108. Therefore, oxygen in the semi-conductive oxide film 105a, which might be reduced by the first heat treatment, can be supplied from the first insulator 108. Accordingly, charge trapping centers in the semi-conductive oxide film 105a can be decreased.

The first heat treatment and the second heat treatment are applied, whereby the semi-conductive oxide film 105a can be highly purified so as to contain impurities other than main components as little as possible. The highly purified semi-conductive oxide film 105a contains extremely few carriers derived from a donor. The carrier concentration can be lower than $1\times10^{14}/cm^3$, preferably lower than $1\times10^{12}/cm^3$, more preferably lower than $1\times10^{11}/cm^3$.

Next, a second insulator 109 which has a flat surface is formed. Various organic materials may be used for forming the second insulator 109. Then, the first insulator 108 and the second insulator 109 are selectively etched, so that a contact hole reaching the drain electrode 107b is formed. A display electrode 110 which is in contact with the drain electrode 107b through this contact hole is formed (see FIG. 1F).

A light-transmitting material or a reflective material can be used for the display electrode 110. For the light-transmitting material, a conductive oxide whose band gap is greater than or equal to 3 electron-volts, such as an In—Sn-based oxide or a Zn—Al-based oxide, can be used. A metal nanowire or a carbon film (graphene or the like) with a thickness of less than or equal to 3 nm can also be used. For the reflective material, a film formed using any of various metal materials (aluminum, silver, and the like) can be used. The surface of a reflective display electrode is preferably provided with an irregular unevenness to display white color.

Figure 8A:
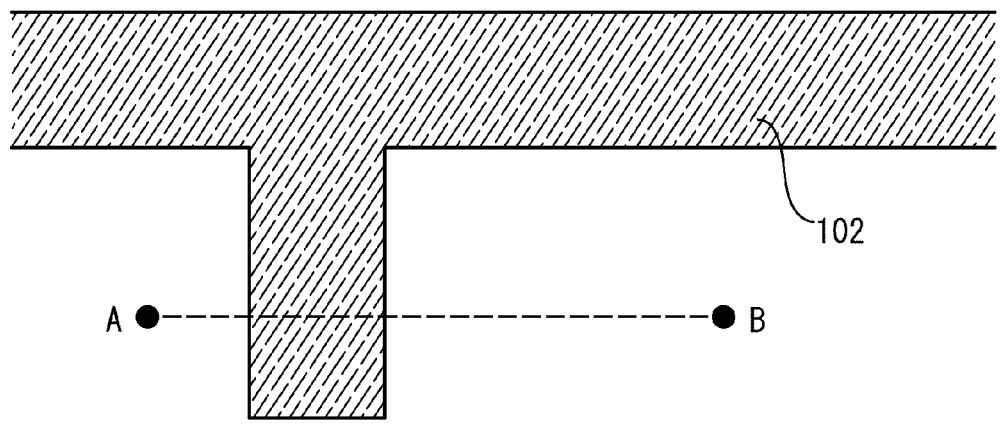
FIGS. 8A to 8C are diagrams illustrating an embodiment of a semiconductor device.
Figure 8B:
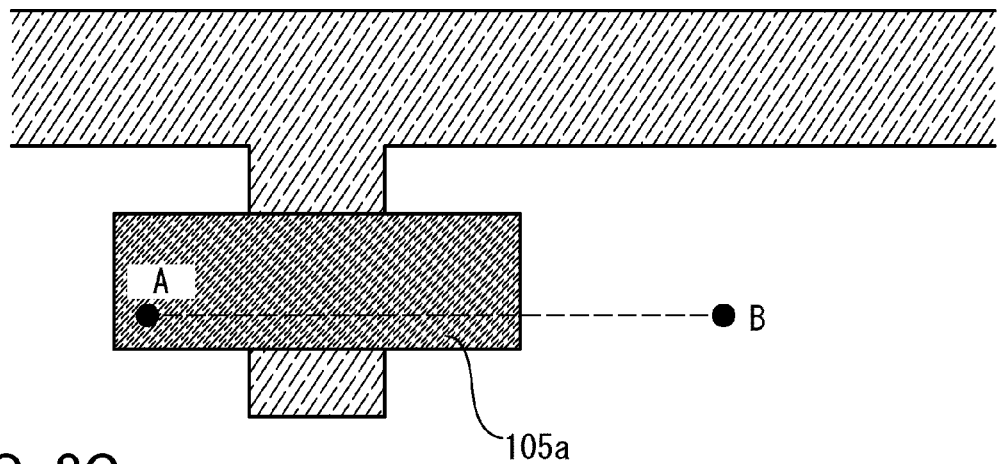
Figure 8C:
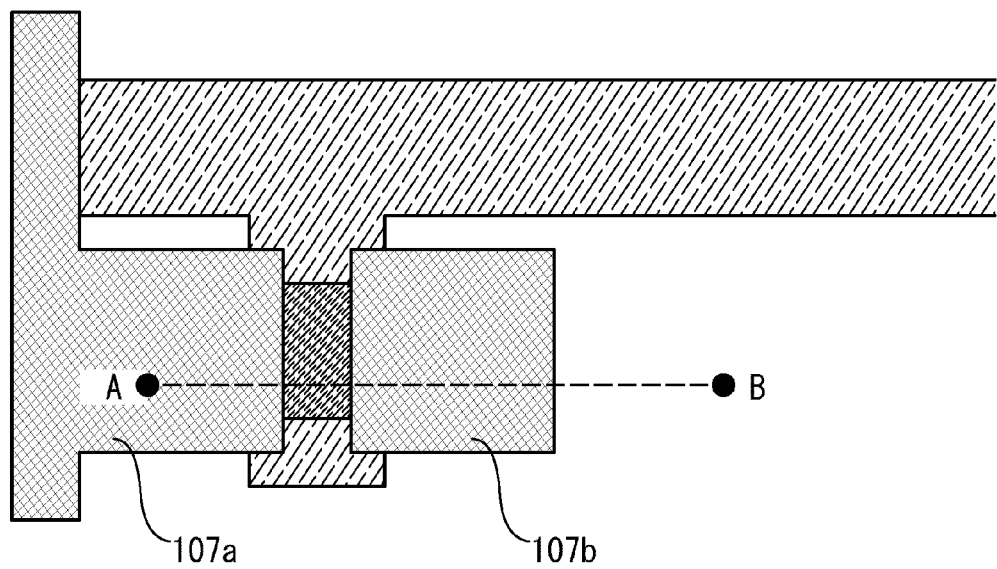

FIGS. 8A to 8C illustrate states of the above-described manufacturing process which are seen from above. A cross section taken along a dashed line connecting a point A and a point B in each of FIGS. 8A to 8C corresponds to FIGS. 1A to 1F. FIG. 8A corresponds to the state illustrated in FIG. 1A; here, the first gate insulator 103, the oxide film 104, and the like are not illustrated. FIG. 8B corresponds to the state illustrated in FIG. 1E. In addition, FIG. 8C illustrates an intermediate step state between the step illustrated in FIG. 1E and the step illustrated in FIG. 1F. In other words, FIG. 8C illustrates a state just after the n-type semi-conductive oxide films 106a and 106b, the source electrode 107a, and the drain electrode 107b are formed after the step illustrated in FIG. 1E.

Also in this embodiment, the insulating oxide layer 104b in which gallium is a main metal element is used. When such a material is in contact with a semi-conductive oxide in which, in particular, the ratio of gallium in a metal element is greater than or equal to 0.2, charge trapping at an interface between the insulating oxide layer 104b and a semi-conductive oxide film can be sufficiently suppressed. Accordingly, a highly reliable semiconductor device can be provided.

In this embodiment, the manufacturing process of the display device using a transistor is described; it is apparent that the method disclosed in this embodiment can be applied not only to a display device but also to an electronic device of another embodiment (e.g., an integrated circuit).

Embodiment 2

In this embodiment, an example in which a display device including a transistor having a different structure from the transistor described in Embodiment 1 is manufactured will be described. FIGS. 2A to 2F are cross-sectional views illustrating a manufacturing process of the display device of this embodiment. The transistor described in this embodiment includes a semi-conductive oxide as a semiconductor and is a bottom-gate transistor. In addition, the transistor described in this embodiment is a bottom-contact transistor whose source electrode and drain electrode are in contact with a lower surface of a semiconductor layer.

The outline of a manufacturing process will be described below. Note that for the structures denoted by the same reference numerals as those in Embodiment 1, a material, a means, a condition, and the like described in Embodiment 1 may be used as those in this embodiment unless otherwise specified. As illustrated in FIG. 2A, the gate electrode 102, the first gate insulator 103, and the oxide film 104 are formed over the substrate 101 having an insulating surface.

The thickness of the first gate insulator 103 needs to be determined in accordance with the composition and thickness of the oxide film 104 for the same reason described in Embodiment 1. The first gate insulator 103 is not necessarily provided. The oxide film 104 is an oxide of gallium and zinc in this embodiment, and the ratio of gallium, that is, Ga/(Ga+Zn), may be 0.2 to 0.6, preferably 0.3 to 0.5. The oxide film 104 is formed by a DC sputtering method, a pulsed DC sputtering method, or an AC sputtering method.

Figure 2B:
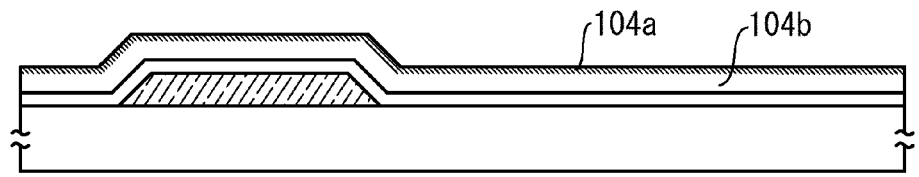

Next, the substrate 101 provided with these is heated at 400° C. to 700° C. for 10 minutes to 24 hours under an appropriate atmosphere, for example, under the condition that the pressure is 10 Pa to 1 normal atmospheric pressure and an atmosphere is any of an oxygen atmosphere, a nitrogen atmosphere, and a mixed atmosphere of oxygen and nitrogen. Then, the quality of the oxide film 104 is changed as illustrated in FIG. 2B, and a semi-conductive oxide layer 104a having high concentration of zinc is formed in the vicinity of a surface of the oxide film 104, and another portion becomes an insulating oxide layer 104b having low concentration of zinc. Note that the boundary between the semi-conductive oxide layer 104a and the insulating oxide layer 104b is not clear.

Figure 2C:
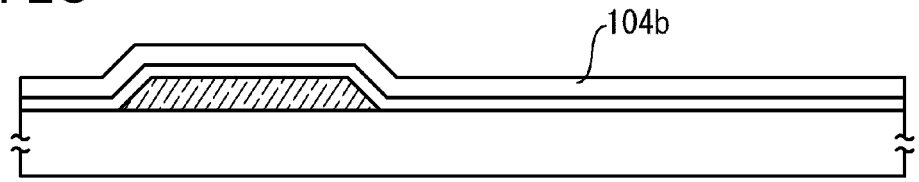

The obtained semi-conductive oxide layer 104a is removed as illustrated in FIG. 2C. At this time, not only the semi-conductive oxide layer 104a but also a portion of the insulating oxide layer 104b, which is close to the semi-conductive oxide layer 104a, may be etched. Alternatively, the obtained semi-conductive oxide layer 104a may be removed by continuing the heat treatment and vaporizing the semi-conductive oxide layer 104a. Through the above steps, the ratio of gallium, that is, Ga/(Ga+Zn), may be greater than or equal to 0.7, preferably greater than or equal to 0.8 on the surface of the insulating oxide layer 104b.

Figure 2D:
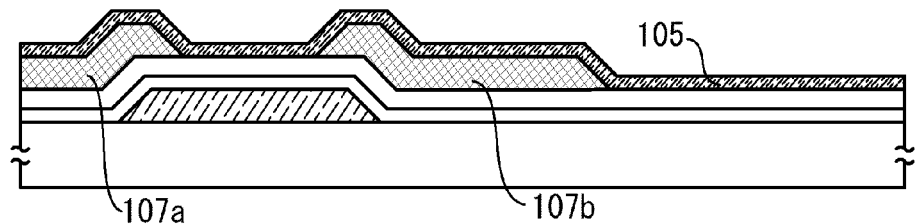

After that, a conductive film such as a metal film is deposited and processed to have a desired shape, so that the source electrode 107a and the drain electrode 107b are formed as illustrated in FIG. 2D. Further, the semi-conductive oxide film 105 is formed thereover.

Figure 2E:
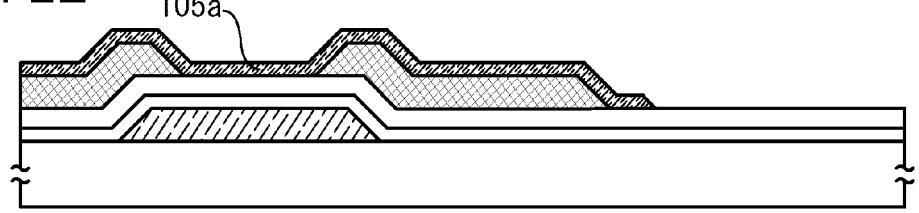
Figure 2F:
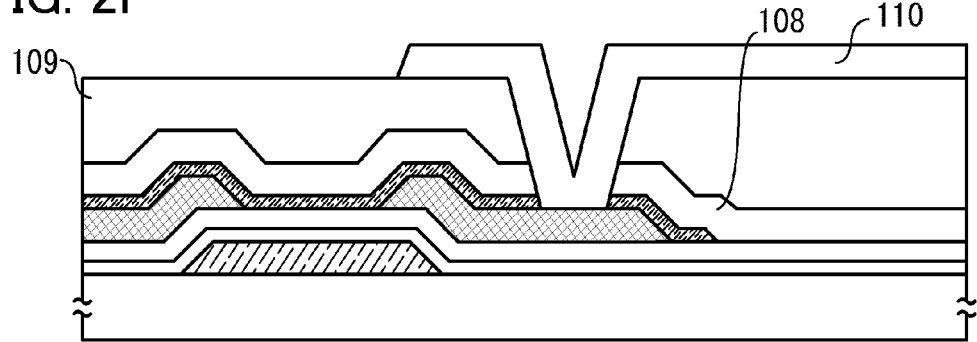

As illustrated in FIG. 2E, the semi-conductive oxide film 105 is etched, whereby a semi-conductive oxide film 105a having a desired shape (e.g., island shape) is obtained. In the etching, a dry etching method or a wet etching method may be used. Note that as the etching here, the insulating oxide layer 104b may be used as an etching stopper. After that, the plasma treatment described in Embodiment 1 may be performed. In addition, the first heat treatment described in Embodiment 1 may be performed before or after this step. In the above manner, a basic structure of a transistor is completed.

Further, the first insulator 108 is formed. After the first insulator 108 is formed, the second heat treatment may be performed. Next, the second insulator 109 which has a flat surface is formed. Then, the first insulator 108 and the second insulator 109 are selectively etched, so that a contact hole reaching the drain electrode 107b is formed. The display electrode 110 which is in contact with the drain electrode 107b through this contact hole is formed (see FIG. 2F).

The difference between the transistor described in this embodiment and that described in Embodiment 1 is only positional relation between the semi-conductive oxide film 105 and the source and drain electrodes 107a and 107b. Therefore, the structure of the transistor seen from above is almost the same as the structure illustrated in FIG. 8C.

Also in this embodiment, the insulating oxide layer 104b in which gallium is a main metal element is used. When such a material is in contact with a semi-conductive oxide in which, in particular, the ratio of gallium in a metal element is greater than or equal to 0.2, charge trapping at an interface between the insulating oxide layer 104b and a semi-conductive oxide film can be sufficiently suppressed. Accordingly, a highly reliable semiconductor device can be provided.

In this embodiment, the manufacturing process of the display device using a transistor is described; it is apparent that the method disclosed in this embodiment can be applied not only to a display device but also an electronic device of another embodiment (e.g., an integrated circuit).

Embodiment 3

In this embodiment, an example in which a display device including a transistor having a different structure from the transistors described in the above embodiments is manufactured will be described. FIGS. 3A to 3F are cross-sectional views illustrating a manufacturing process of the display device of this embodiment. The transistor described in this embodiment includes a semi-conductive oxide as a semiconductor and is a top-gate transistor in which a gate is formed over a semiconductor layer. In addition, the transistor described in this embodiment is a top-contact transistor whose source electrode and drain electrode are in contact with an upper surface of a semiconductor layer.

Figure 3A:
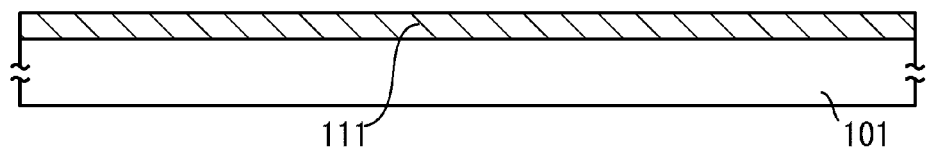
FIGS. 3A to 3F are cross-sectional views illustrating a manufacturing process of Embodiment 3.

The outline of a manufacturing process will be described below. Note that for the structures denoted by the same reference numerals as those in Embodiment 1, a material, a means, a condition, and the like described in Embodiment 1 may be used as those in this embodiment unless otherwise specified. As illustrated in FIG. 3A, an oxide film 111 is formed over the substrate 101. Note that since the oxide film 111 becomes an insulating oxide through a step such as heat treatment performed later, the surface of the substrate 101 may have conductivity.

Further, in the case where unfavorable impurities for a transistor are included in a substrate, it is preferable that a film of an insulating material having a function of blocking the impurities (e.g., aluminum nitride, aluminum oxide, or silicon nitride) be provided between the substrate 101 and the oxide film 111. Note that in this embodiment, the oxide film 111 can have a similar function because it becomes an oxide in which gallium is a main metal element in heat treatment performed later.

The oxide film 111 is an oxide of gallium and zinc in this embodiment, and the ratio of gallium, that is, Ga/(Ga+Zn), may be 0.2 to 0.6, preferably 0.3 to 0.5. The oxide film 111 is formed by a DC sputtering method, a pulsed DC sputtering method, or an AC sputtering method. In addition, the thickness of the oxide film 111 may be more than or equal to 100 nm and less than or equal to 1000 nm. The oxide film 111 can be formed in a manner similar to that of the oxide film 104 in Embodiment 1.

Figure 3B:
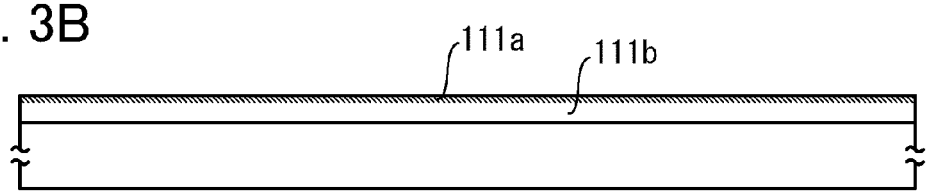

Next, the substrate 101 is heated at 400° C. to 700° C. for 10 minutes to 24 hours under an appropriate atmosphere, for example, under the condition that the pressure is 10 Pa to 1 normal atmospheric pressure and an atmosphere is any of an oxygen atmosphere, a nitrogen atmosphere, and a mixed atmosphere of oxygen and nitrogen. Then, the quality of the oxide film 111 is changed as illustrated in FIG. 3B, and a semi-conductive oxide layer 111a having high concentration of zinc is formed in the vicinity of a surface of the oxide film 111, and another portion becomes an insulating oxide layer 111b having low concentration of zinc. Note that the boundary between the semi-conductive oxide layer 111a and the insulating oxide layer 111b is not clear.

Figure 3C:
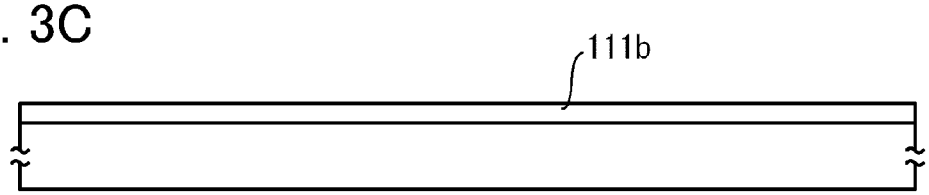

The obtained semi-conductive oxide layer 111a is removed as illustrated in FIG. 3C. At this time, not only the semi-conductive oxide layer 111a but also a portion of the insulating oxide layer 111b, which is close to the semi-conductive oxide layer 111a may be etched. For example, a portion regarded as the insulating oxide layer 111b, which is close to the semi-conductive oxide layer 111a, may be etched by 10% to 50% of the thickness of the insulating oxide layer 111b.

Alternatively, the semi-conductive oxide layer 111a may be removed by continuing the heat treatment and vaporizing the semi-conductive oxide layer 111a. By any method, the ratio of gallium, that is, Ga/(Ga+Zn), may be greater than or equal to 0.7, preferably greater than or equal to 0.8 on the surface of the insulating oxide layer 111b.

In this embodiment, since the insulating oxide layer 111b is an oxide in which gallium is a main metal element, the insulating oxide layer 111b has a function of blocking hydrogen and an alkali metal.

In this embodiment, the insulating oxide layer 111b in which gallium is a main metal element and which contains zinc is represented by the chemical formula, $Ga_xZn_{1-x}O_y$, (note that X≥0.7); however, it is preferable that oxygen exceed the stoichiometric ratio so as to satisfy $x/2+1<y<x/2+1.5$. In order to achieve this, after the surface of the insulating oxide layer 111b is exposed as illustrated in FIG. 3C, heat treatment may be performed under an oxygen atmosphere or exposure to oxygen plasma may be performed.

Figure 3D:
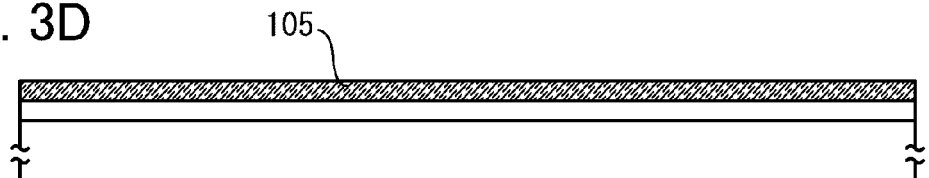

After that, the semi-conductive oxide film 105 is formed over the insulating oxide layer 111b as illustrated in FIG. 3D. For the formation condition and the like of the semi-conductive oxide film 105, those in Embodiment 1 may be referred to.

Then, the semi-conductive oxide film 105 is etched, whereby the semi-conductive oxide film 105a having a desired shape (e.g., island shape) is obtained. In the etching, a dry etching method or a wet etching method may be used.

Note that as the etching here, the insulating oxide layer 111b may be used as an etching stopper. After that, the plasma treatment described in Embodiment 1 may be performed. In addition, the first heat treatment described in Embodiment 1 may be performed before or after this step.

Figure 3E:
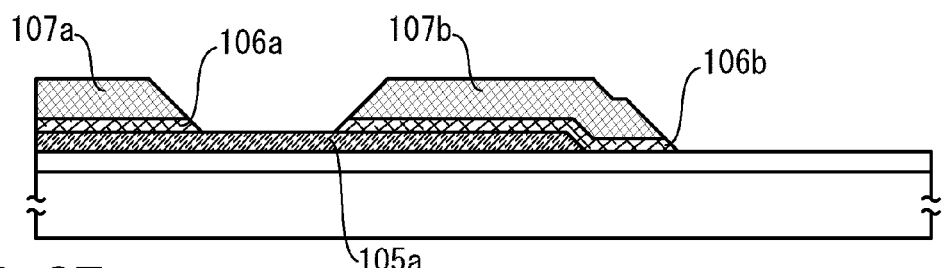
Figure 3F:
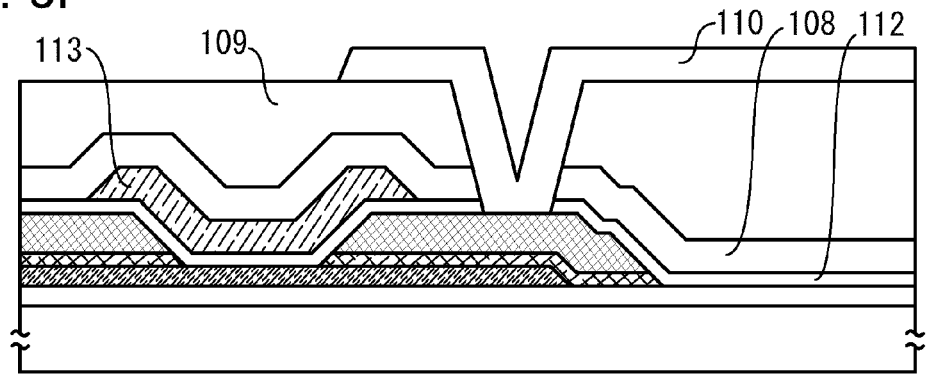

After that, a semi-conductive oxide film having n-type conductivity and a conductive film such as a metal film are deposited and each processed to have a desired shape, so that the n-type semi-conductive oxide films 106a and 106b and the source and drain electrodes 107a and 107b are formed (see FIG. 3E). Note that the n-type semi-conductive oxide films 106a and 106b are not necessarily provided.

Further, a gate insulator 112 is deposited. For a formation method of the gate insulator 112, the formation method of the first gate insulator 103 in Embodiment 1 may be referred to. The thickness of the gate insulator 112 may be set to a thickness which a transistor to be formed needs.

A gate electrode 113 is formed over the gate insulator 112. The gate electrode 113 can be a single layer or a stacked layer using a metal element such as molybdenum, titanium, chromium, tantalum, tungsten, aluminum, or copper, or an alloy material which includes any of these materials as a main metal element. Because the threshold value or the like of the obtained transistor is changed due to a work function of a material to be used for the gate electrode 113, it is necessary to select a material in accordance with the required threshold value or the like. In the above manner, a basic structure of a transistor is completed.

Further, the first insulator 108 is formed by a sputtering method, a CVD method, or the like. After the first insulator 108 is formed, the second heat treatment may be performed. Next, the second insulator 109 which has a flat surface is formed. Then, the first insulator 108 and the second insulator 109 are selectively etched, so that a contact hole reaching the drain electrode 107b is formed. The display electrode 110 which is in contact with the drain electrode 107b through this contact hole is formed (see FIG. 3F).

The large difference between the transistor described in this embodiment and that described in Embodiment 1 is positional relation between the semi-conductive oxide film 105 and the gate electrode 113. However, the position of the gate electrode 102 in a substrate surface in FIG. 1F is almost the same as that of the gate electrode 113 in FIG. 3F. Therefore, the structure of the transistor seen from above is almost the same as the structure illustrated in FIG. 8C.

Also in this embodiment, the insulating oxide layer 111b in which gallium is a main metal element is used. When such a material is in contact with a semi-conductive oxide film in which, in particular, the ratio of gallium in a metal element is greater than or equal to 0.2, charge trapping at an interface between the insulating oxide layer 111b and the semi-conductive oxide film can be sufficiently suppressed. Accordingly, a highly reliable semiconductor device can be provided.

In this embodiment, the manufacturing process of the display device using a transistor is described; it is apparent that the method disclosed in this embodiment can be applied not only to a display device but also an electronic device of another embodiment (e.g., an integrated circuit).

Embodiment 4

In this embodiment, an example in which a display device including a top-gate transistor like the transistor described in Embodiment 3 is manufactured will be described; however, the transistor in this embodiment is a bottom-contact transistor whose source electrode and drain electrode are in contact with a lower surface of a semiconductor layer. FIGS. 4A to 4F are cross-sectional views illustrating a manufacturing process of the display device of this embodiment.

Figure 4A:
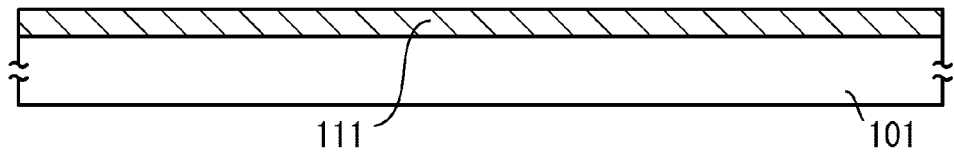
FIGS. 4A to 4F are cross-sectional views illustrating a manufacturing process of Embodiment 4.

The outline of a manufacturing process will be described below. Note that for the structures denoted by the same reference numerals as those in Embodiment 1 or 3, a material, a means, a condition, and the like described in Embodiment 1 or 3 may be used as those in this embodiment unless otherwise specified. As illustrated in FIG. 4A, the oxide film 111 is formed over the substrate 101. The surface of the substrate 101 may have conductivity as in Embodiment 3.

The oxide film 111 is an oxide of gallium and zinc in this embodiment, and the ratio of gallium, that is, Ga/(Ga+Zn), may be 0.2 to 0.6, preferably 0.3 to 0.5. The oxide film 111 is formed by a DC sputtering method, a pulsed DC sputtering method, or an AC sputtering method. In addition, the thickness of the oxide film 111 may be more than or equal to 100 nm and less than or equal to 1000 nm.

Figure 4B:
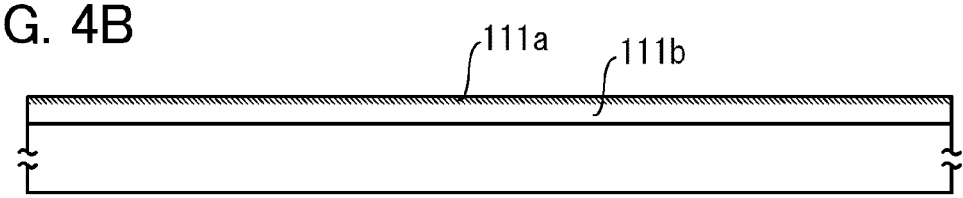

Next, the substrate 101 is heated at 400° C. to 700° C. for 10 minutes to 24 hours under an appropriate atmosphere, for example, under the condition that the pressure is 10 Pa to 1 normal atmospheric pressure and an atmosphere is any of an oxygen atmosphere, a nitrogen atmosphere, and a mixed atmosphere of oxygen and nitrogen. Then, the quality of the oxide film 111 is changed as illustrated in FIG. 4B, and the semi-conductive oxide layer 111a having high concentration of zinc is formed in the vicinity of a surface of the oxide film 111, and another portion becomes the insulating oxide layer 111b having low concentration of zinc. Note that the boundary between the semi-conductive oxide layer 111a and the insulating oxide layer 111b is not clear.

Figure 4C:
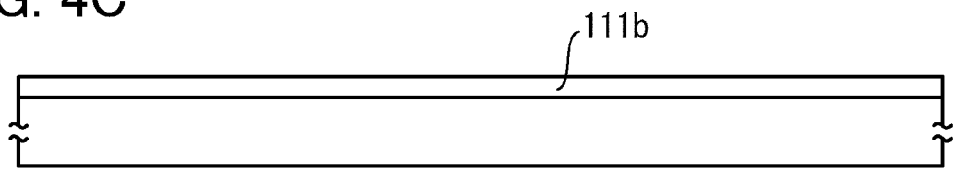

The obtained semi-conductive oxide layer 111a is removed as illustrated in FIG. 4C. At this time, not only the semi-conductive oxide layer 111a but also a portion of the insulating oxide layer 111b, which is close to the semi-conductive oxide layer 111a, may be etched. Alternatively, the semi-conductive oxide layer 111a may be removed by continuing the heat treatment and vaporizing the semi-conductive oxide layer 111a.

In this manner, the ratio of gallium, that is, Ga/(Ga+Zn), may be greater than or equal to 0.7, preferably greater than or equal to 0.8 on the surface of the insulating oxide layer 111b. Further, after that, heat treatment may be performed under an oxygen atmosphere or exposure to oxygen plasma may be performed.

Figure 4D:
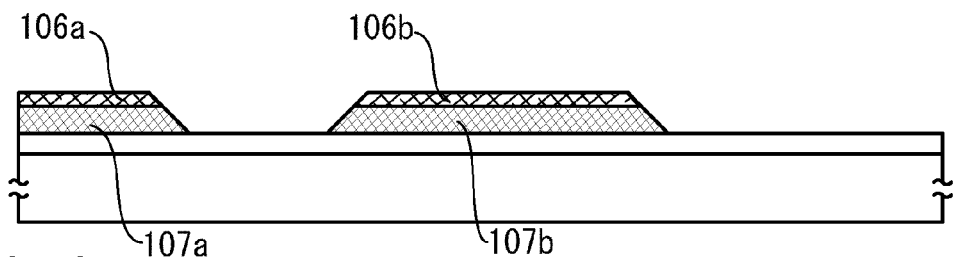

After that, a semi-conductive oxide film having n-type conductivity and a conductive film such as a metal film are deposited and each processed to have a desired shape, so that the n-type semi-conductive oxide films 106a and 106b and the source and drain electrodes 107a and 107b are formed (see FIG. 4D). Note that the n-type semi-conductive oxide films 106a and 106b are not necessarily provided.

Figure 4E:
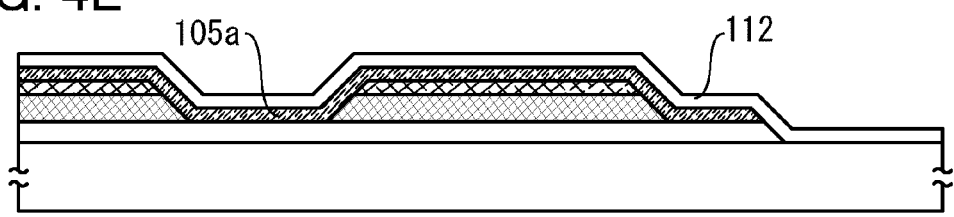
Figure 4F:
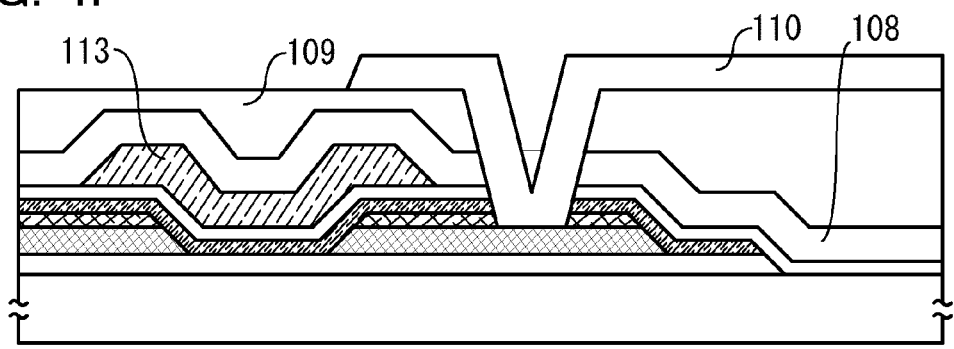

Then, as illustrated in FIG. 4E, a semi-conductive oxide film is formed over the n-type semi-conductive oxide films 106a and 106b and the source and drain electrodes 107a and 107b and etched, whereby the semi-conductive oxide film 105a having a desired shape (e.g., island shape) is obtained. In addition, the gate insulator 112 is deposited.

The gate electrode 113 is formed over the gate insulator 112. For a material for the gate electrode 113, Embodiment 3 may be referred to. Further, the first insulator 108 is formed by a sputtering method, a CVD method, or the like. Next, the second insulator 109 which has a flat surface is formed. Then, the first insulator 108 and the second insulator 109 are selectively etched, so that a contact hole reaching the drain electrode 107b is formed. The display electrode 110 which is in contact with the drain electrode 107b through this contact hole is formed (see FIG. 4F).

In this embodiment, the manufacturing process of the display device using a transistor is described; it is apparent that the method disclosed in this embodiment can be applied not only to a display device but also an electronic device of another embodiment (e.g., an integrated circuit).

Embodiment 5

Figure 5A:
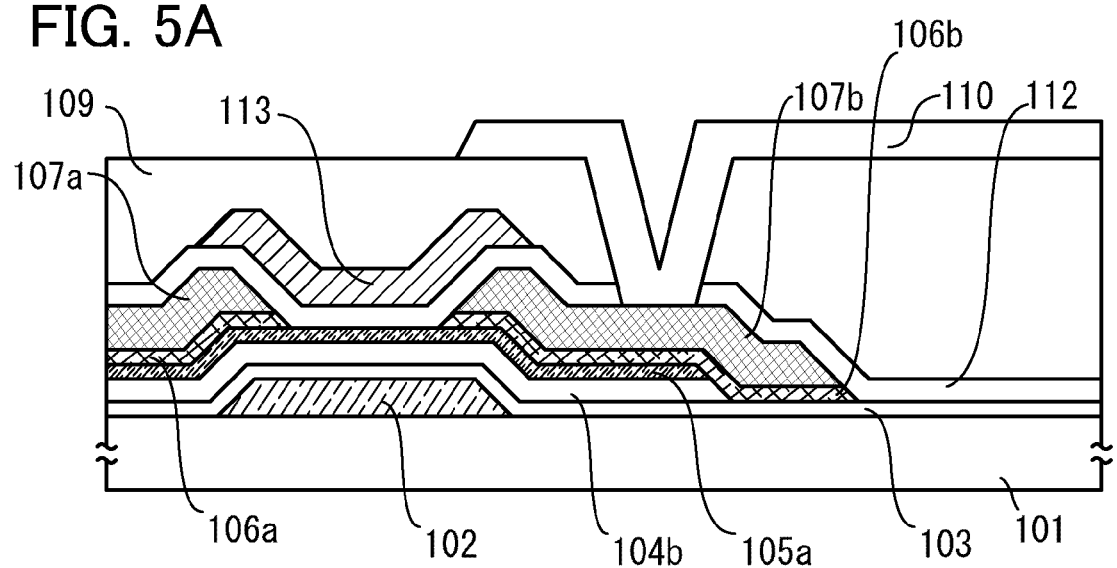
FIGS. 5A and 5B are cross-sectional views of Embodiments 5 and 6.

In this embodiment, an example of a display device having a transistor which is different from the transistor described in any of the above embodiments will be described. A transistor illustrated in FIG. 5A is one of dual-gate transistors including two gate electrodes above and below a semiconductor layer.

The transistor includes, over the substrate 101 having an insulating surface, the first gate electrode 102, the first gate insulator 103, the insulating oxide layer 104b which includes gallium as a main metal element, the semi-conductive oxide films 105a, the n-type semi-conductive oxide films 106a and 106b, the source electrode 107a, the drain electrode 107b, the second gate insulator 112, and the second gate electrode 113. Further, the display device described in this embodiment includes the insulator 109 having a flat surface, and the display electrode 110 connected to the drain electrode 107b through a contact hole which penetrates the insulator 109 and the second gate insulator 112 and which reaches the drain electrode 107b.

In the above transistor, for materials, manufacturing methods, and the like of the second gate insulator 112 and the second gate electrode 113, refer to those of the gate insulator 112 and the gate electrode 113 of Embodiment 3 or 4. For the other components, refer to the contents described in Embodiment 1.

When a semi-conductive oxide layer is used as a semiconductor layer in a transistor, the threshold voltage of the transistor sometimes shifts in the positive or negative direction depending on a manufacturing process of a semiconductor device in some cases. Therefore, like the above-described transistor, a dual-gate transistor in which the second gate electrode 113 is provided over the second gate insulator 112 so that the threshold voltage can be controlled is preferably used. The potential of the first gate electrode 102 or the potential of the second gate electrode 113 is controlled, whereby the threshold voltage can be made to be an appropriate level.

Further, the first gate electrode 102 and the second gate electrode 113 can block light irradiation from the outside; thus, variation in the electric characteristics of the transistor due to light irradiation performed on the semi-conductive oxide film 105a can be suppressed.

In this embodiment, the manufacturing process of the display device using a transistor is described; it is apparent that the method disclosed in this embodiment can be applied not only to a display device but also an electronic device of another embodiment (e.g., an integrated circuit).

Embodiment 6

Figure 5B:
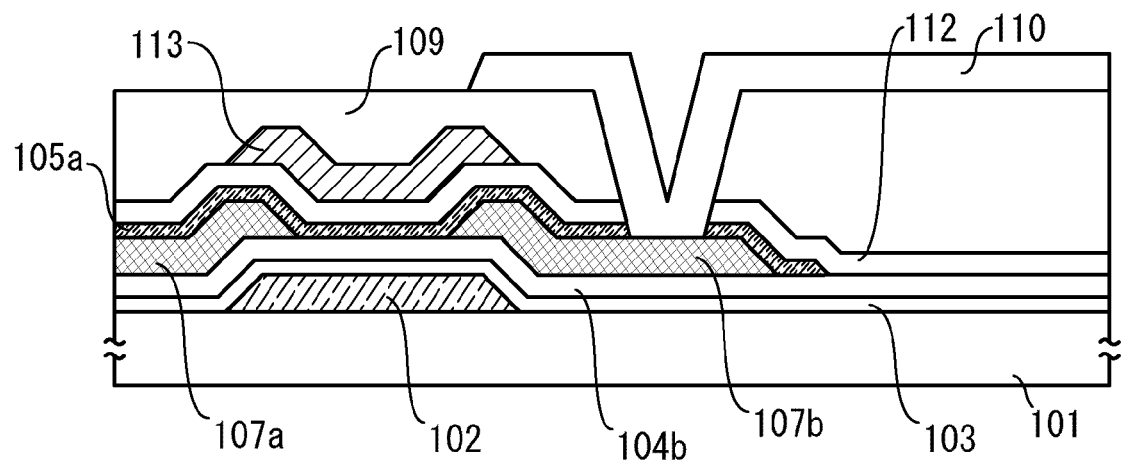

In this embodiment, an example of a display device having a dual-gate transistor which is different from the dual-gate transistor described in Embodiment 5 is illustrated in FIG. 5B. This display device includes, over the substrate 101 having an insulating surface, the first gate electrode 102, the first gate insulator 103, the insulating oxide layer 104b which includes gallium as a main metal element, the source electrode 107a, the drain electrode 107b, the semi-conductive oxide film 105a, the second gate insulator 112, and the second gate electrode 113.

Further, the display device described in this embodiment includes the insulator 109 having a flat surface, and the display electrode 110 connected to the drain electrode 107b through a contact hole which penetrates the insulator 109 and the second gate insulator 112 and which reaches the drain electrode 107b.

In the above transistor, for materials, manufacturing methods, and the like of the second gate insulator 112 and the second gate electrode 113, those of the gate insulator 112 and the gate electrode 113 of Embodiment 3 or 4 may be referred to. For the other components, the contents described in Embodiment 1 or 2 may be referred to. The display device illustrated in FIG. 5B differs from that in FIG. 5A in the positional relation between the semi-conductive oxide film 105a, and the source electrode 107a and the drain electrode 107b.

Embodiment 7

In Embodiment 1, the semi-conductive oxide layer 104a obtained by performing heat treatment on the oxide film 104 is removed; however, in this embodiment, the semi-conductive oxide layer 104a is used as a semiconductor while remaining FIGS. 6A to 6E are cross-sectional views illustrating a manufacturing process of a semiconductor device of this embodiment. A transistor described in this embodiment is a bottom-gate top-contact transistor as in Embodiment 1. For the components used in this embodiment, those in Embodiment 1 may be referred to unless otherwise specified.

Figure 6A:
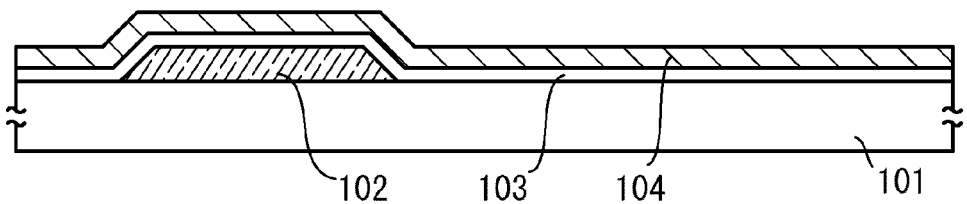
FIGS. 6A to 6E are cross-sectional views illustrating a manufacturing process of Embodiment 7.

The outline of a manufacturing process will be described below. As illustrated in FIG. 6A, the gate electrode 102, the first gate insulator 103, and the oxide film 104 are formed over the substrate 101 having an insulating surface. The first gate insulator 103 is not necessarily provided. The oxide film 104 is an oxide of gallium and zinc in this embodiment, and the ratio of gallium, that is, Ga/(Ga+Zn), may be 0.2 to 0.6, preferably 0.3 to 0.5.

Figure 6B:
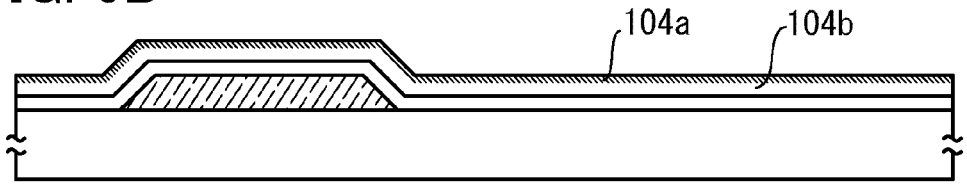

The oxide film 104 is formed by a DC sputtering method, a pulsed DC sputtering method, or an AC sputtering method. Next, the substrate 101 provided with these is heated at 400° C. to 700° C. for 10 minutes to 24 hours under an appropriate atmosphere, for example, under the condition that the pressure is 10 Pa to 1 normal atmospheric pressure and an atmosphere is any of an oxygen atmosphere, a nitrogen atmosphere, and a mixed atmosphere of oxygen and nitrogen. Then, the quality of the oxide film 104 is changed as illustrated in FIG. 6B, and the semi-conductive oxide layer 104a having high concentration of zinc is formed in the vicinity of a surface of the oxide film 104, and another portion becomes an insulating oxide layer 104b having low concentration of zinc.

Note that in this heat treatment, an alkali metal such as lithium, sodium, or potassium is also segregated in the vicinity of the surface of the semi-conductive oxide layer 104a or evaporated; therefore, the concentration in the insulating oxide layer 104b is sufficiently reduced. These alkali metals are unfavorable elements for a transistor; thus, it is preferable that these alkali metals be contained in a material used for forming the transistor as little as possible.

After that, a semi-conductive oxide film is formed. As a material for the semi-conductive oxide film, for example, an indium-gallium-based oxide is preferably used. That is, a material represented by a chemical formula, $In_{1-x}Ga_xO_y$ ($0.2 \le x \le 1$) is used. The thickness of the semi-conductive oxide film is preferably 0.5 to 2 times as large as the thickness of a portion which can be regarded as the semi-conductive oxide layer 104a.

By heating in film formation, heat treatment in a later step, or the like, the semi-conductive oxide layer 104a is mixed with the semi-conductive oxide film, so that the semi-conductive oxide film 105 is obtained. When the above conditions are satisfied, the semi-conductive oxide film 105 is represented by a chemical formula, $In_{1-x}Ga_xZn_zO_{y+2z+v}$ ($0.2 \le x \le 1$). Here, $x/(1+z) \ge 0.2$ is preferable.

An alkali metal such as lithium, sodium, or potassium or an alkaline-earth metal is unfavorable element for a transistor; therefore, it is preferable that the concentration thereof in the semi-conductive oxide film 105 be low.

For example, the concentration of sodium in the semi-conductive oxide film 105 may be lower than or equal to $5 \times 10^{16}$ cm$^{-3}$, preferably lower than or equal to $1 \times 10^{16}$ cm$^{-3}$, more preferably lower than or equal to $1 \times 10^{15}$ cm$^{-3}$. Similarly, the concentration of lithium in the semi-conductive oxide film 105 may be lower than or equal to $5 \times 10^{15}$ cm$^{-3}$, preferably lower than or equal to $1 \times 10^{15}$ cm$^{-3}$ and the concentration of potassium in the semi-conductive oxide film 105 may be lower than or equal to $5 \times 10^{15}$ cm$^{-3}$, preferably lower than or equal to $1 \times 10^{15}$ cm$^{-3}$.

Note that since an interface between the semi-conductive oxide layer 104a and the insulating oxide layer 104b is originally not clear, an interface between the semi-conductive oxide film 105 and the insulating oxide layer 104b is also not clear. In a general transistor, there is a clear interface; therefore, a phenomenon due to the interface, such as charge trapped at the interface or scattering at the interface, causes deterioration of a transport property of the transistor. The above-described structure in which the interface is not clear is effective in preventing such deterioration.

Figure 6C:
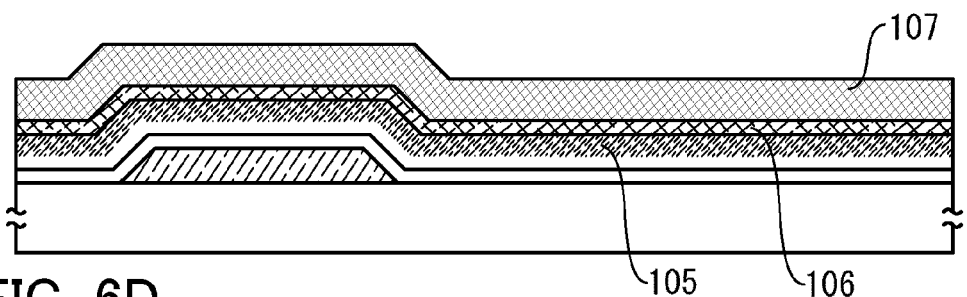

Further, the n-type semi-conductive oxide film 106 and the conductive film 107 are deposited (see FIG. 6C). The n-type semi-conductive oxide film 106 is not necessarily provided. Note that after the gate electrode 102 is formed, the step of forming the first gate insulator 103 to the step of forming the conductive film 107 can be successively performed without exposure to the air. In consideration of deterioration of a semi-conductive oxide due to an atmospheric component (especially water), these steps are preferably performed without exposure to the air.

Figure 6D:
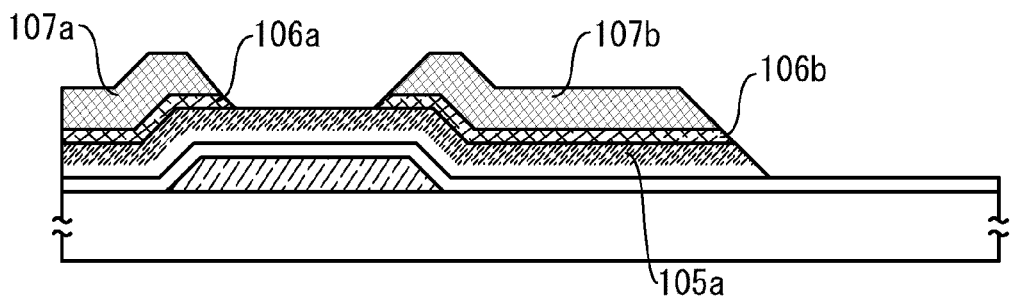
Figure 6E:
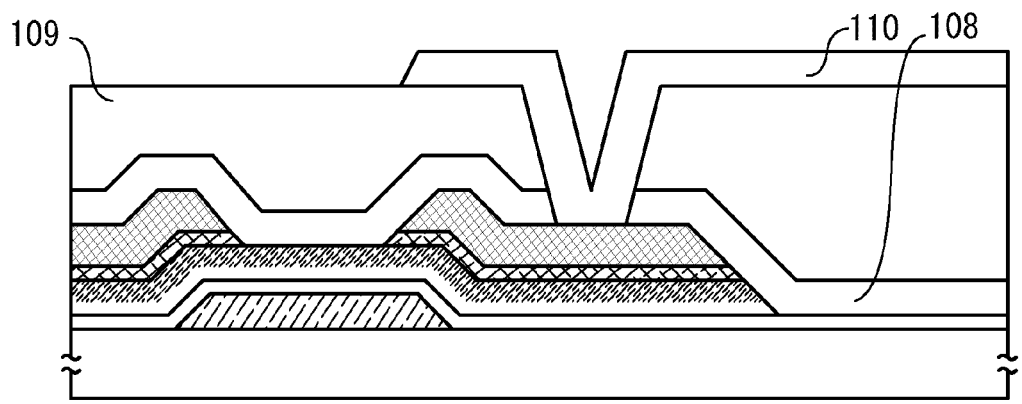

After that, by plural times of etching, the conductive film 107, the n-type semi-conductive oxide film 106, the semi-conductive oxide film 105, and the insulating oxide layer 104b are processed to have desired shapes, so that the semi-conductive oxide film 105a, the n-type semi-conductive oxide films 106a and 106b, and the source and drain electrodes 107a and 107b are formed as illustrated in FIG. 6D. Note that the first heat treatment described in Embodiment 1 may be performed at any timing after the semi-conductive oxide film 105 is formed.

Further, the first insulator 108 and the second insulator 109 which has a flat surface are formed. After the first insulator 108 is formed, the second heat treatment described in Embodiment 1 may be performed. Then, the first insulator 108 and the second insulator 109 are selectively etched, so that a contact hole reaching the drain electrode 107b is formed. The display electrode 110 which is in contact with the drain electrode 107b through this contact hole is formed (see FIG. 6E).

In this embodiment, the manufacturing process of the display device using a transistor is described; it is apparent that the method disclosed in this embodiment can be applied not only to a display device but also an electronic device of another embodiment (e.g., an integrated circuit).

Embodiment 8

In Embodiment 7, the display device including a bottom-gate transistor is described as an example; however, in this embodiment, a display device including a top-gate transistor is described. FIGS. 7A to 7E are cross-sectional views illustrating a manufacturing process of a semiconductor device of this embodiment. The transistor described in this embodiment is a top-gate top-contact transistor as in Embodiment 3. For the components used in this embodiment, those in Embodiment 1 or 3 may be referred to unless otherwise specified.

Figure 7A:
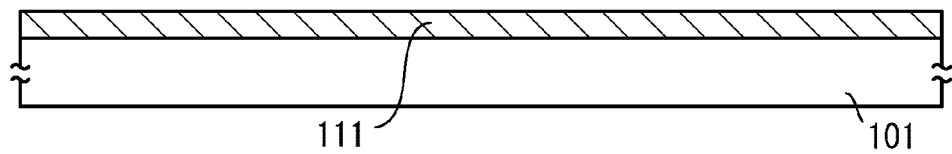
FIGS. 7A to 7E are cross-sectional views illustrating a manufacturing process of Embodiment 8.

The outline of a manufacturing process will be described below. As illustrated in FIG. 7A, the oxide film 111 is formed over the substrate 101. The oxide film 111 is an oxide of gallium and zinc in this embodiment, and the ratio of gallium, that is, Ga/(Ga+Zn), may be 0.2 to 0.6, preferably 0.3 to 0.5.

Figure 7B:
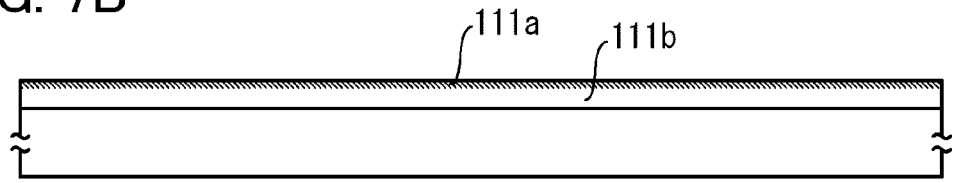

Next, the substrate 101 is heated at 400° C. to 700° C. for 10 minutes to 24 hours under an appropriate atmosphere, for example, under the condition that the pressure is 10 Pa to 1 normal atmospheric pressure and an atmosphere is any of an oxygen atmosphere, a nitrogen atmosphere, and a mixed atmosphere of oxygen and nitrogen. Then, the quality of the oxide film 111 is changed as illustrated in FIG. 7B, and the semi-conductive oxide layer 111a having high concentration of zinc is formed in the vicinity of a surface of the oxide film 111, and another portion becomes the insulating oxide layer 111b having low concentration of zinc.

After that, a semi-conductive oxide film is formed. As a material for the semi-conductive oxide film, for example, an indium-gallium-based oxide is preferably used. That is, a material represented by the chemical formula, $In_{1-x}Ga_xO_y$ ($0.2 \leq x \leq 1$) is used. The thickness of the semi-conductive oxide film is preferably 0.5 to 2 times as large as the thickness of a portion which can be regarded as the semi-conductive oxide layer 111a.

Figure 7C:
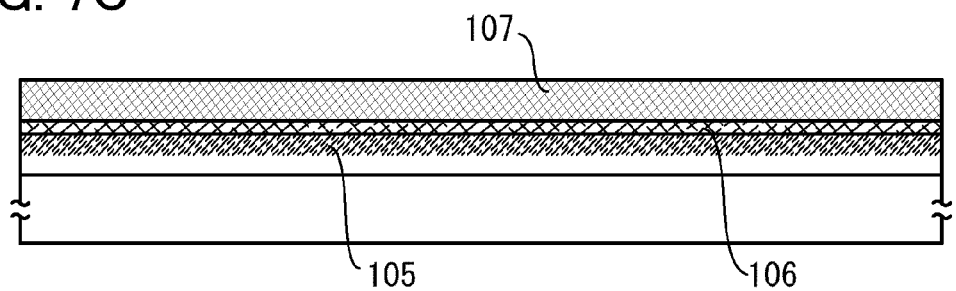

By heating in film formation, heat treatment in a later step, or the like, the semi-conductive oxide layer 111a is mixed with the semi-conductive oxide film to be the semi-conductive oxide film 105 (see FIG. 7C). When the above conditions are satisfied, the semi-conductive oxide film 105 is represented by the chemical formula, $In_{1-x}Ga_xZn_zO_{y+2z+v}$ ($0.2 \leq x \leq 1$). Here, $x/(1+z) \geq 0.2$ is preferable.

Note that since the interface between the semi-conductive oxide layer 111a and the insulating oxide layer 111b is originally not clear, the interface between the semi-conductive oxide film 105 and the insulating oxide layer 111b is also not clear. This is effective in preventing deterioration of a transport property of the transistor due to the interface.

Further, the n-type semi-conductive oxide film 106 and the conductive film 107 are deposited. The n-type semi-conductive oxide film 106 is not necessarily provided. Note that the step of forming the oxide film 111 to the step of forming the conductive film 107 can be successively performed without exposure to the air. In consideration of deterioration of a semi-conductive oxide due to an atmospheric component (especially water), these steps are preferably performed without exposure to the air.

Figure 7D:
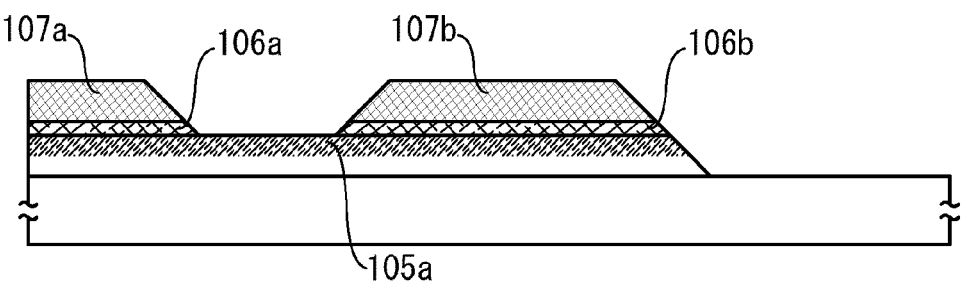
Figure 7E:
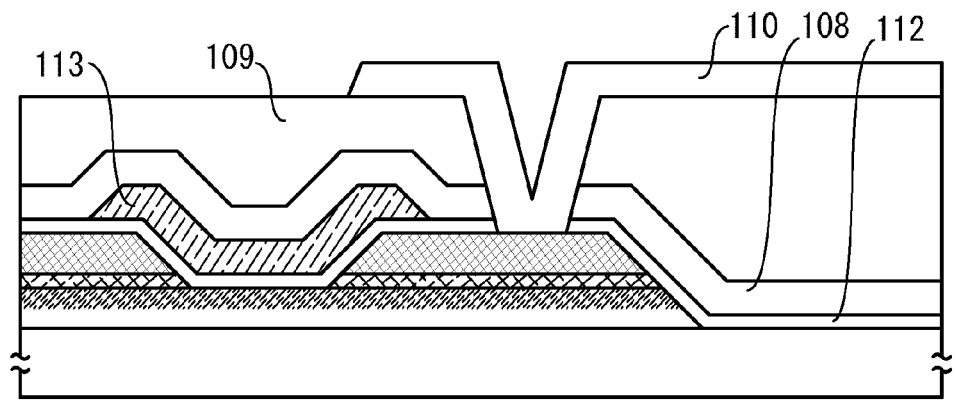

After that, by plural times of etching, the conductive film 107, the n-type semi-conductive oxide film 106, the semi-conductive oxide film 105, and the insulating oxide layer 111b are each processed to have a desired shape, so that the semi-conductive oxide film 105a, the n-type semi-conductive oxide films 106a and 106b, and the source and drain electrodes 107a and 107b are formed as illustrated in FIG. 7D. Note that the first heat treatment described in Embodiment 1 may be performed at any timing after the semi-conductive oxide film 105 is formed.

Further, the gate insulator 112, the gate electrode 113, the first insulator 108, and the second insulator 109 which has a flat surface are formed. After the first insulator 108 is formed, the second heat treatment described in Embodiment 1 may be performed. Then, the gate insulator 112, the first insulator 108, and the second insulator 109 are selectively etched, so that a contact hole reaching the drain electrode 107b is formed. The display electrode 110 which is in contact with the drain electrode 107b through this contact hole is formed (see FIG. 7E).

In this embodiment, the manufacturing process of the display device using a transistor is described; it is apparent that the method disclosed in this embodiment can be applied not only to a display device but also an electronic device of another embodiment (e.g., an integrated circuit).

Embodiment 9

The display device disclosed in any of Embodiments 1 to 8 can be applied to a variety of electronic devices (including an amusement machine). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

In addition, a transistor having the structure disclosed in any of Embodiments 1 to 8 can be used for, other than a display device, various integrated circuits (including a memory device), an electronic device which incorporates the integrated circuits, an electric device which incorporates the integrated circuits, and the like, for example.

Further, a step of obtaining the insulating oxide layer 104b or the insulating oxide layer 111b by performing heat treatment on the oxide film 104 or the oxide film 111 which is described in any of Embodiments 1 to 8 can be used for, for example, manufacturing a dielectric or electrode of a capacitor of an integrated circuit as well as manufacturing a display device or a transistor.

This application is based on Japanese Patent Application serial no. 2010-187873 filed with Japan Patent Office on Aug. 25, 2010, the entire contents of which are hereby incorporated by reference.

What is claimed is:

1. An electronic device comprising:
   a substrate;
   an oxide film over the substrate; and
   a semi-conductive oxide film over and in contact with the oxide film,
   wherein the oxide film comprises at least a first metal element and a second metal element,
   wherein a portion in contact with the semi-conductive oxide film has higher concentration of the first metal element in the oxide film than a portion facing the substrate, and
   wherein the portion in contact with the semi-conductive oxide film has lower concentration of the second metal element in the oxide film than the portion facing the substrate.

2. The electronic device according to claim 1, wherein the semi-conductive oxide film has an amorphous state.

3. The electronic device according to claim 1, wherein the semi-conductive oxide film is in a single-crystal state.

4. The electronic device according to claim 1, wherein the semi-conductive oxide film has a crystal.

5. The electronic device according to claim 1, wherein the semi-conductive oxide film has a crystal which is c-axis-aligned.

6. The electronic device according to claim 1, wherein the oxide film has a concentration gradient of the first metal element.

7. The electronic device according to claim 1, wherein the first metal element is zinc and the second metal element is gallium.

8. An electronic device comprising:
   a substrate;
   a gate electrode over the substrate;
   a gate insulator over the gate electrode;
   an oxide film over the gate insulator; and
   a semi-conductive oxide film over and in contact with the oxide film,
   wherein the oxide film comprises at least a first metal element and a second metal element, wherein a portion in contact with the semi-conductive oxide film has higher concentration of the first metal element in the oxide film than a portion facing the substrate, and wherein the portion in contact with the semi-conductive oxide film has lower concentration of the second metal element in the oxide film than the portion facing the substrate.

9. The electronic device according to claim 8, wherein the semi-conductive oxide film has an amorphous state.

10. The electronic device according to claim 8, wherein the semi-conductive oxide film is in a single-crystal state.

11. The electronic device according to claim 8, wherein the semi-conductive oxide film has a crystal.

12. The electronic device according to claim 8, wherein the semi-conductive oxide film has a crystal which is c-axis-aligned.

13. The electronic device according to claim 8, wherein the oxide film has a concentration gradient of the first metal element.

14. The electronic device according to claim 8, wherein the first metal element is zinc and the second metal element is gallium.

15. An electronic device comprising:
a substrate;
a gate electrode over the substrate;
a gate insulator over the gate electrode;
an oxide film over the gate insulator;
a semi-conductive oxide film over and in contact with the oxide film;
n-type semi-conductive oxide films over and in contact with the semi-conductive oxide film,
wherein the oxide film comprises at least a first metal element and a second metal element,
wherein a portion in contact with the semi-conductive oxide film has higher concentration of the first metal element in the oxide film than a portion facing the substrate, and
wherein the portion in contact with the semi-conductive oxide film has lower concentration of the second metal element in the oxide film than the portion facing the substrate.

16. The electronic device according to claim 15, wherein the semi-conductive oxide film has an amorphous state.

17. The electronic device according to claim 15, wherein the semi-conductive oxide film is in a single-crystal state.

18. The electronic device according to claim 15, wherein the semi-conductive oxide film has a crystal.

19. The electronic device according to claim 15, wherein the semi-conductive oxide film has a crystal which is c-axis-aligned.

20. The electronic device according to claim 15, wherein the oxide film has a concentration gradient of the first metal element.

21. The electronic device according to claim 15, wherein the first metal element is zinc and the second metal element is gallium.

* * * * *